United States Patent
Ishimori

(10) Patent No.: US 8,648,372 B2
(45) Date of Patent: Feb. 11, 2014

(54) LIGHT-EMITTING DEVICE, METHOD FOR ADJUSTING OPTICAL PROPERTIES, AND METHOD FOR MANUFACTURING LIGHT-EMITTING DEVICES

(75) Inventor: Atsuyoshi Ishimori, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/264,141

(22) PCT Filed: Apr. 9, 2010

(86) PCT No.: PCT/JP2010/056800
§ 371 (c)(1),
(2), (4) Date: Oct. 12, 2011

(87) PCT Pub. No.: WO2010/119934
PCT Pub. Date: Oct. 21, 2010

(65) Prior Publication Data
US 2012/0037940 A1    Feb. 16, 2012

(30) Foreign Application Priority Data
Apr. 14, 2009   (JP) .................................. 2009-097934

(51) Int. Cl.
*H01L 33/00*  (2010.01)

(52) U.S. Cl.
USPC  257/98; 257/79; 257/E33.061; 257/E33.067; 257/E33.068; 257/E33.071; 438/27; 438/29

(58) Field of Classification Search
USPC ............................................. 257/98; 438/16
See application file for complete search history.

(56) References Cited

U.S. PATENT DOCUMENTS

| | | | | |
|---|---|---|---|---|
| 2003/0019843 | A1* | 1/2003 | Kawai et al. ................. | 216/108 |
| 2005/0184638 | A1* | 8/2005 | Mueller et al. ............... | 313/485 |
| 2006/0258028 | A1* | 11/2006 | Paolini et al. ................. | 438/22 |
| 2007/0069633 | A1 | 3/2007 | Kameyama et al. | |
| 2008/0180025 | A1* | 7/2008 | Baba et al. ................... | 313/504 |
| 2008/0217636 | A1* | 9/2008 | Bechtel et al. ................ | 257/98 |
| 2009/0184624 | A1 | 7/2009 | Schmidt et al. | |
| 2011/0205740 | A1* | 8/2011 | Rindt et al. .................. | 362/293 |

FOREIGN PATENT DOCUMENTS

| | | |
|---|---|---|
| JP | 2001-015817 | 1/2001 |
| JP | 2001-177158 | 6/2001 |
| JP | 2004-071357 | 3/2004 |
| JP | 2004-186488 | 7/2004 |
| JP | 2005-268323 | 9/2005 |
| JP | 2006-156187 | 6/2006 |
| JP | 2006-303303 | 11/2006 |

(Continued)

OTHER PUBLICATIONS

Huang et al. Particle size Effect on the Packaging Performance of YAG:Ce Phosphors in White LEDs. Apr. 6, 2009. Int. J. Appl. Ceram. Technol. 6[4] 465-469.*

*Primary Examiner* — Julio J Maldonado
*Assistant Examiner* — Molly Reida

(57) ABSTRACT

A light emitting device includes a plurality of LEDs that each emit light. A wavelength conversion member converts wavelengths of at least part of the light emitted from the LEDs to at least one other wavelength, and outputs light obtained by combining light having at least two wavelengths emitted from the wavelength conversion member. At least part of a light emitting surface of the wavelength conversion member has a surface state that differs from other parts of the light emitting surface.

9 Claims, 28 Drawing Sheets

(56) References Cited

FOREIGN PATENT DOCUMENTS

| | | |
|---|---|---|
| JP | 2007-095807 | 4/2007 |
| JP | 2007-173397 | 7/2007 |
| JP | 2008-515184 | 5/2008 |
| WO | 2006/035353 | 4/2006 |
| WO | 2007/148829 | 12/2007 |

* cited by examiner

FIG. 5
Grain diameter of 8 μm
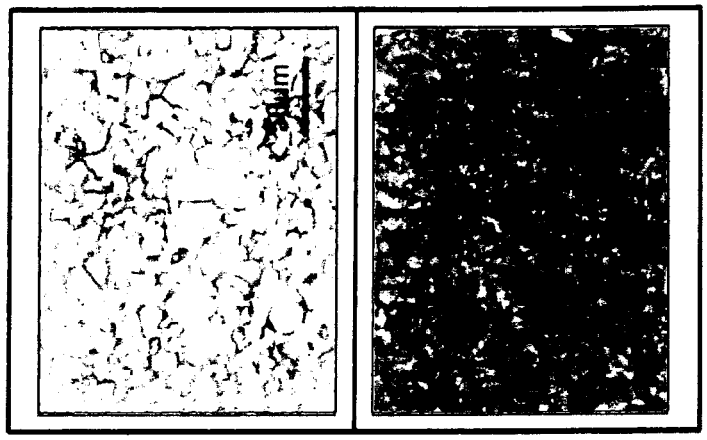
W/E
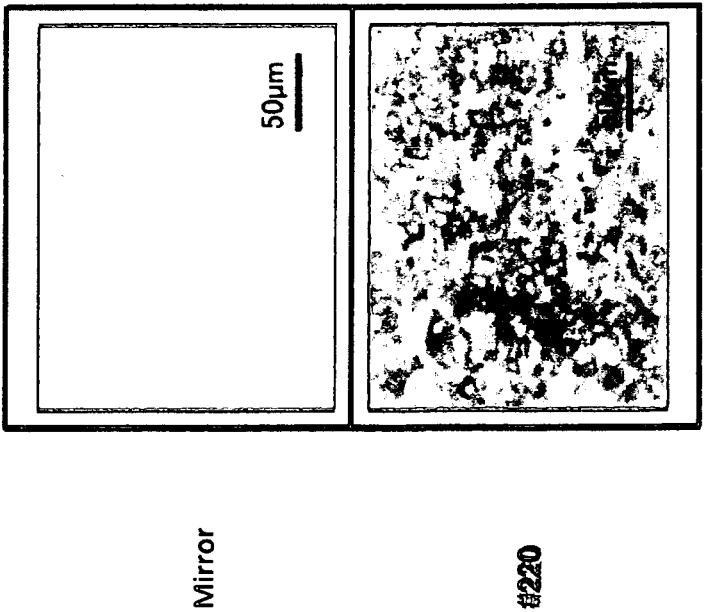
Mirror
220

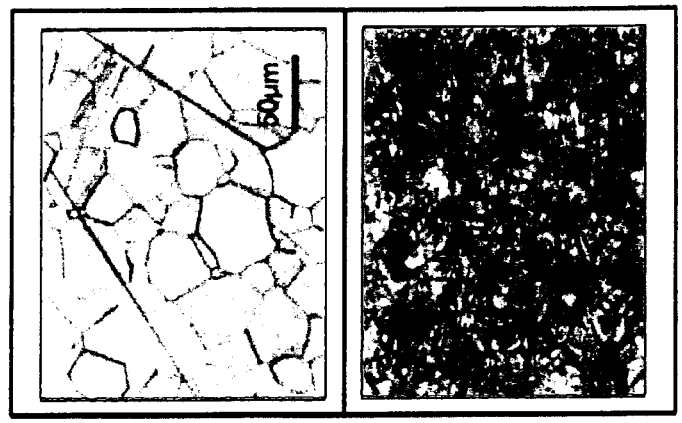
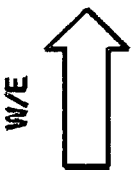
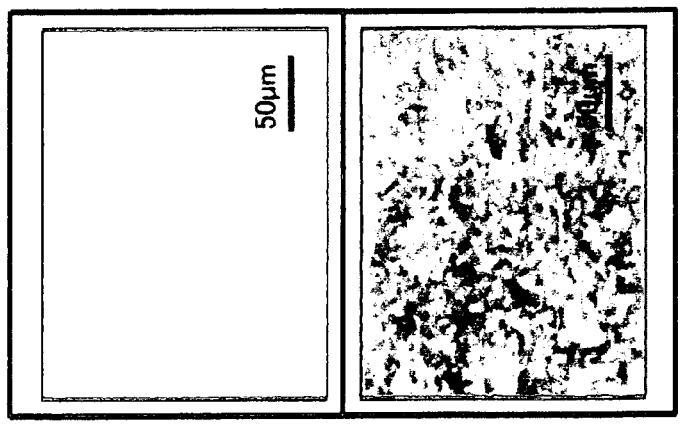
FIG. 6

FIG. 7
Grain diameter of 30 μm
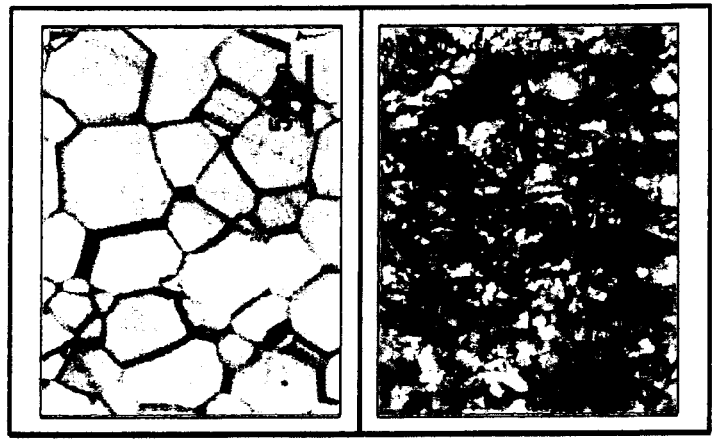
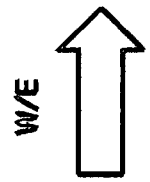
W/E
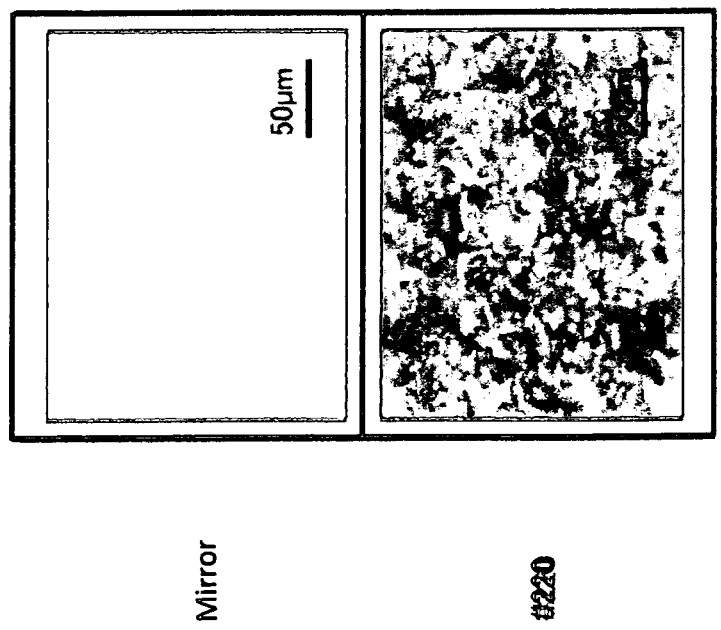
Mirror
220

FIG. 8
Grain diameter of 45 μm
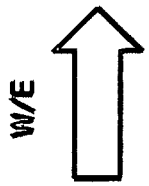
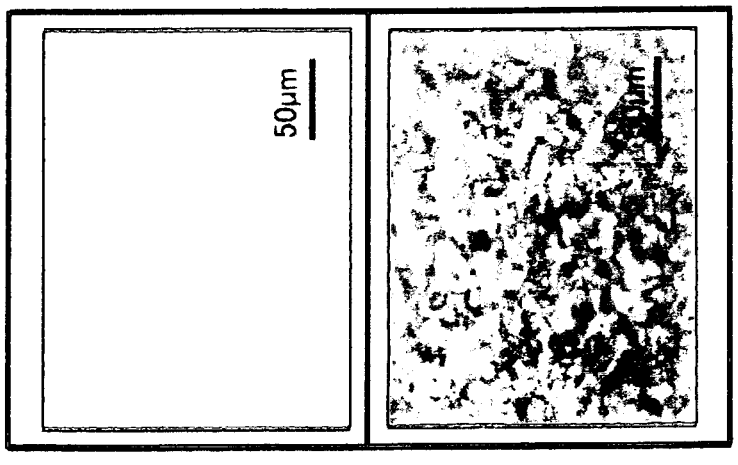
Mirror

FIG. 9
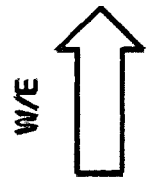
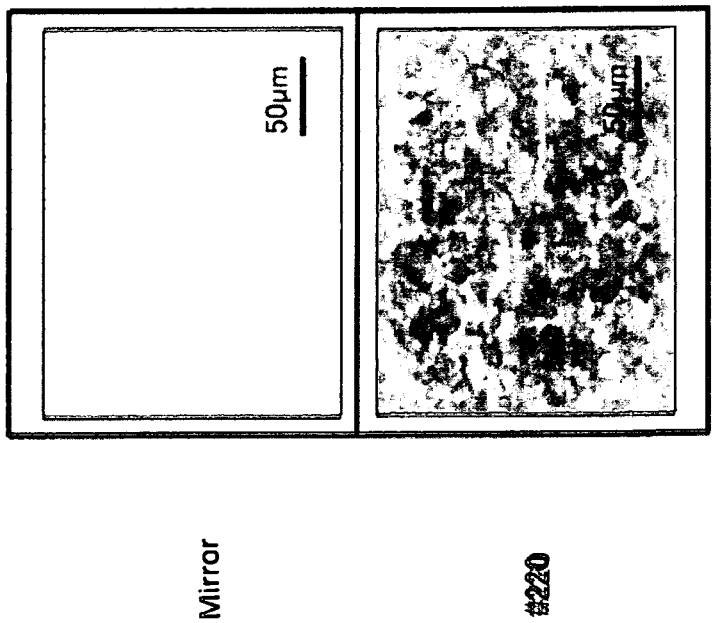
Grain diameter of 60 μm
Mirror
220

FIG. 16

| Grain diameter [μm] | State | Without W/E | | With W/E | |
|---|---|---|---|---|---|
| | | x | y | x | y |
| 8 | Mirror | 0.2 | 0.12 | 0.27 | 0.23 |
| | #220 | 0.35 | 0.37 | 0.36 | 0.4 |
| 23 | Mirror | 0.2 | 0.12 | 0.25 | 0.2 |
| | #220 | 0.34 | 0.37 | 0.35 | 0.38 |
| 30 | Mirror | 0.2 | 0.12 | 0.26 | 0.21 |
| | #220 | 0.35 | 0.38 | 0.35 | 0.39 |
| 45 | Mirror | 0.21 | 0.13 | 0.25 | 0.2 |
| | #600 | 0.31 | 0.3 | | |
| | #220 | 0.33 | 0.35 | 0.35 | 0.39 |
| | #140 | 0.34 | 0.37 | | |
| 60 | Mirror | 0.2 | 0.12 | 0.24 | 0.18 |
| | #220 | 0.34 | 0.37 | 0.35 | 0.38 |

| Surface roughness Ra | [μm] |
|---|---|
| #2000 | 0.005~0.01 |
| #600 | 0.30~0.45 |
| #220 | 0.52~0.87 |
| #140 | 0.63~1.1 |

LIGHT-EMITTING DEVICE, METHOD FOR ADJUSTING OPTICAL PROPERTIES, AND METHOD FOR MANUFACTURING LIGHT-EMITTING DEVICES

TECHNICAL FIELD

The present invention relates to a light emitting device including light emitting elements and a wavelength conversion member converting a wavelength of light emitted from the light emitting elements, a method for adjusting optical properties, and a method for manufacturing the light emitting device.

BACKGROUND ART

There have been known, as light emitting elements, light emitting diodes (hereinafter, simply referred to as "LEDs") each containing a semiconductor multilayer film. Especially, GaN LEDs emitting blue light are applicable to a light emitting device or the like emitting white light in combination with a wavelength conversion member containing a phosphor material (hereinafter, also referred to as "phosphor") for converting a wavelength of blue light into a wavelength of yellow light (see Patent Literature 1, for example).

Here, the above phosphor is a phosphor containing a light absorbing material that absorbs wavelengths of at least part of light emitted from LEDs, a phosphor containing a fluorescent material that is excited by light emitted from LEDs and thereby emits light having a wavelength different from a wavelength of light emitted from the LEDs, and the like.

As the above wavelength conversion member for use in a light emitting device utilizing LEDs, the following have been conventionally employed: a wavelength conversion member that is made of a phosphor paste, which is obtained by dispersing a phosphor in a translucent resin such as a silicone resin, is provided on an upper surface of an LED, and a phosphor having a high density that is precipitated and is arranged immediately adjacent to the LED; a wavelength conversion member made of a phosphor paste formed beforehand to be plate-like that is arranged on or applied to the upper surface of the LED; a wavelength conversion member made of a phosphor paste that is arranged directly on the upper surface of the LED by a print method, a potting method, or the like; a wavelength conversion member made of a so-called ceramic plate formed beforehand in which a phosphor is included that is applied on the upper surface of the LED.

In the case where a wavelength conversion member containing a phosphor is applied in combination with LEDs as described above, the optical properties can be controlled by adjusting the thickness of the wavelength conversion member (see Patent Literatures 2 and 3, for example).

Also, the optical properties can be similarly controlled by adjusting the concentration of a phosphor material contained in the wavelength conversion member.

That is, in order to exhibit required optical properties of light obtained by combining light emitted from LEDs and light wavelength-converted by the wavelength conversion member, the light emitting device such as described above is designed to have the thickness of the wavelength conversion member, the concentration of the phosphor material, and so on based on the intensity and wavelength of light.

CITATION LIST

Patent Literature

[Patent Literature 1]
Japanese Patent Application Publication No. 2001-15817

[Patent Literature 2]
Japanese Patent Application Publication No. 2001-177158

[Patent Literature 3]
Japanese Patent Application Publication No. 2004-186488

SUMMARY OF INVENTION

Technical Problem

According to the above light emitting device, it is true that desired optical properties can be exhibited by adjusting the thickness of the wavelength conversion member, the concentration of the phosphor material, and so on. However, it is impossible to suppress the color unevenness due to the manufacturing variation in LEDs, wavelength conversion member, and so on.

In other words, when a variation occurs in the intensity and wavelength of light emitted from the LEDs, the thickness of the wavelength conversion members, the concentration of the phosphor material, or the like, balance is lost between light emitted from the LEDs and light wavelength-converted by the wavelength conversion members. As a result, the desired optical properties cannot be exhibited.

Note that in the case where color unevenness occurs in light emitted from the wavelength conversion member due to the use of the wavelength conversion member with LEDs emitting light whose color is below the standard, a device (light source) composed of the combination of the LEDs and the wavelength conversion member is regarded as a defective product.

The present invention was made to solve the above problem, and aims to provide a light emitting device capable of outputting light with desired properties even in the case where a variation occurs in light emitting elements, wavelength conversion member, and so on.

Solution to Problem

In order to achieve the above aim, the present invention provides a light emitting device comprising: a light emitting source; and a wavelength conversion member that converts wavelengths of at least part of light emitted from the light emitting source to at least one other wavelength, and outputting light obtained by combining light having at least two wavelengths emitted from the wavelength conversion member, wherein the wavelength conversion member has a light incident surface and a light emitting surface, and at least part of at least one of the light incident surface and the light emitting surface has a surface state which has been adjusted in accordance with an intensity of the light emitted from the light emitting source.

In order to achieve the above aim, the present invention provides a light emitting device comprising: a light emitting source; and a wavelength conversion member that converts wavelengths of at least part of light emitted from the light emitting source to at least one other wavelength, and outputting light obtained by combining light having at least two wavelengths emitted from the wavelength conversion member, wherein the wavelength conversion member has a light incident surface and a light emitting surface, and at least part of at least one of the light incident surface and the light emitting surface has a surface state that differs from parts of the light incident surface and the light emitting surface other than the at least part.

Note that the "optical properties" here indicate properties of light such as color unevenness and chromaticity (including color temperature). Also, the "state of surface" here indicates the surface roughness of the wavelength conversion member, the depth or the pitch of the convexo-concave on the surface of the wavelength conversion member, or a combination of these. Furthermore, the expression here "at least part of at least one of the light incident surface and the light emitting surface has a surface state that differs from parts of the light incident surface and the light emitting surface other than the at least part" indicates the difference between at least part of at least one of the light incident surface and the light emitting surface and other remaining parts of the light incident surface and the light emitting surface in at least one of surface roughness, depth or pitch of the convexo-concave on the surface, and a combination of these, for example. For example, the difference in surface roughness is judged based on the difference in value "Ra" representing the arithmetic average roughness of the surface, and the difference in depth or the pitch of the convexo-concave is judged based on actual measurement values.

Advantageous Effects of Invention

According to the light emitting device relating to the present invention, the wavelength conversion member has the light incident surface and the light emitting surface whose states have been at least partially adjusted. Therefore, even in the case where a variation occurs in light emitting elements, wavelength conversion member, and so on, it is possible to output light with desired optical properties.

Furthermore, at least part of at least one of the light incident surface and the light emitting surface has a surface state that differs from parts of the light incident surface and the light emitting surface other than the at least part. This allows to adjust the optical properties of light output from the at least part. As a result, even in the case where a variation occurs in light emitting elements, wavelength conversion member, and so on, it is possible to output light with desired optical properties.

Also, the surface state may be indicated by a degree of surface roughness. Also, the light incident surface and the light emitting surface each may have a concavo-convex shape, and the surface state may be indicated by at least one of a depth and a pitch of the concavo-convex shape.

Furthermore, the light emitting source may be composed of a plurality of light emitting elements that are mounted on a main surface of a substrate, and the surface state of the at least one of the light incident surface and the light emitting surface may gradually changes from center toward periphery on the surface. Also, the plurality of wavelength conversion members may be each made of a translucent material that contains a phosphor material. Also, the plurality of wavelength conversion members may be each made of a translucent ceramic material that contains a phosphor material.

In order to achieve the above aim, the present invention provides a method for adjusting optical properties of light, the light being obtained by converting wavelengths of at least part of light emitted from a light emitting source to at least one other wavelength by a wavelength conversion member and combining light having at least two wavelengths emitted from the wavelength conversion member, wherein the optical properties are adjusted by changing a state of at least part of at least one of a light incident surface and a light emitting surface of the wavelength conversion member. Note that the "optical properties" here indicate properties of light such as color unevenness and chromaticity (including color temperature).

With this structure, even in the case where a variation occurs in light emitting elements, wavelength conversion member, and so on, it is possible to adjust the optical properties so as to output light with desired properties.

In order to achieve the above aim, a method for manufacturing a light emitting device comprising: a light emitting source; and a wavelength conversion member that converts wavelengths of at least part of light emitted from the light emitting source to at least one other wavelength, and outputting light having optical properties within a predetermined range which is obtained by combining light having at least two wavelengths emitted from the wavelength conversion member, the method comprising: a measuring step of measuring the optical properties of the combined light; and an adjusting step of, when the optical properties measured in the measuring step is out of the predetermined range, adjusting a state of at least part of at least one of a light incident surface and a light emitting surface of the wavelength conversion member. Note that the "optical properties" here indicate properties of light such as color unevenness and chromaticity (including color temperature).

With this structure, even in the case where a variation occurs in light emitting elements, wavelength conversion member, and so on, it is possible to manufacture a light emitting device capable of outputting light with desired properties.

BRIEF DESCRIPTION OF DRAWINGS

FIG. 5 shows the surface state of a wavelength conversion member having a particle diameter of 8 (μm) after each type of surface finishing has been performed.

FIG. 6 shows the surface state of a wavelength conversion member having a particle diameter of 23 (μm) after each type of surface finishing has been performed.

FIG. 7 shows the surface state of a wavelength conversion member having a particle diameter of 30 (μm) after each type of surface finishing has been performed.

FIG. 8 shows the surface state of a wavelength conversion member having a particle diameter of 45 (μm) after each type of surface finishing has been performed.

FIG. 9 shows the surface state of a wavelength conversion member having a particle diameter of 60 (μm) after each type of surface finishing has been performed.

FIG. 16 shows, using chromaticity coordinate values, chromaticity of light output from light emitting devices each using a wavelength conversion member having a different particle diameter and a different surface state.

DESCRIPTION OF EMBODIMENTS

Embodiment 1

1. Structure

Figure 1:
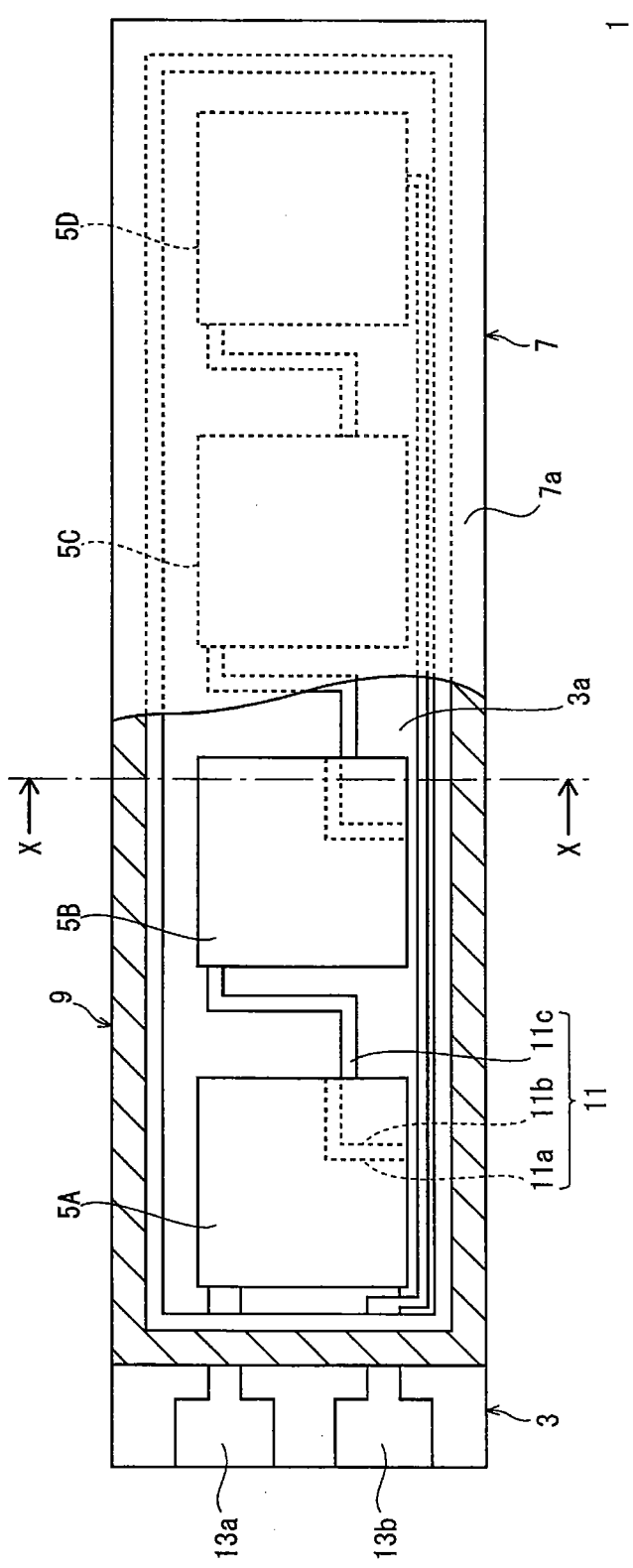
FIG. 1 is a plane view of a light emitting device relating to an embodiment 1.
Figure 2:
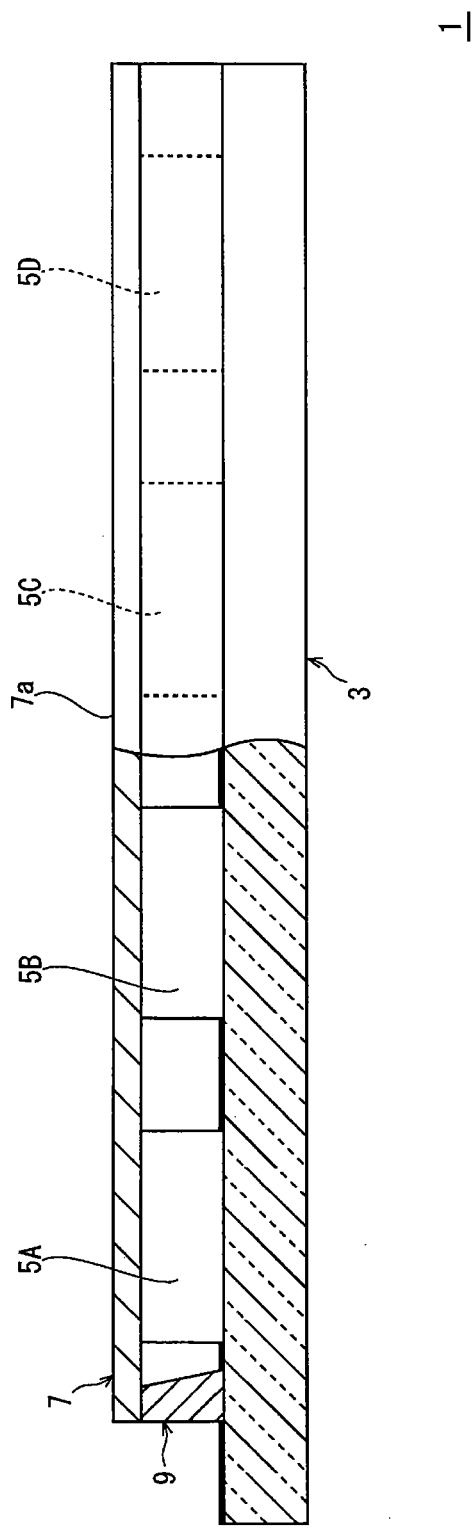
FIG. 2 is a front view of the light emitting device relating to the embodiment 1.

FIG. 1 is a plane view of a light emitting device relating to an embodiment 1, and FIG. 2 is a front view of the light emitting device relating to the embodiment 1. FIG. 1 and FIG. 2 are each a partial cross-sectional view for convenience of understanding the internal structure of the light emitting device.

The light emitting device 1 includes, as shown in FIG. 1 and FIG. 2, a substrate 3, a plurality of, here four, LEDs 5A, 5B, 5C, and 5D mounted on the substrate 3 as light emitting elements, a wavelength conversion member 7 for converting a wavelength of light emitted from each of the LEDs 5A, 5B, 5C, and 5D into other desired wavelength, and a fixing frame 9 for mounting the wavelength conversion member 7 on the substrate 3. Note that when the LEDs 5A, 5B, 5C, and 5D are treated not individually but collectively, they are simply referred to as "LED 5".

The substrate 3 includes, on a main surface 3a thereof, a wiring pattern 11 for electrically connecting to the LED 5 and terminals 13a and 13b for connecting to an external power source which is not illustrated. The wiring pattern 11 is composed of a land 11a for connecting to a p-type electrode of the LED 5, a land 11b for connecting to an n-type electrode of the LED 5, and a land 11c for connecting the land 11a with the land 11b between each two adjacent LEDs 5. Note that the terminals 13a and 13b are electrically connected via the wiring pattern 11 and the LED 5.

Figure 3:
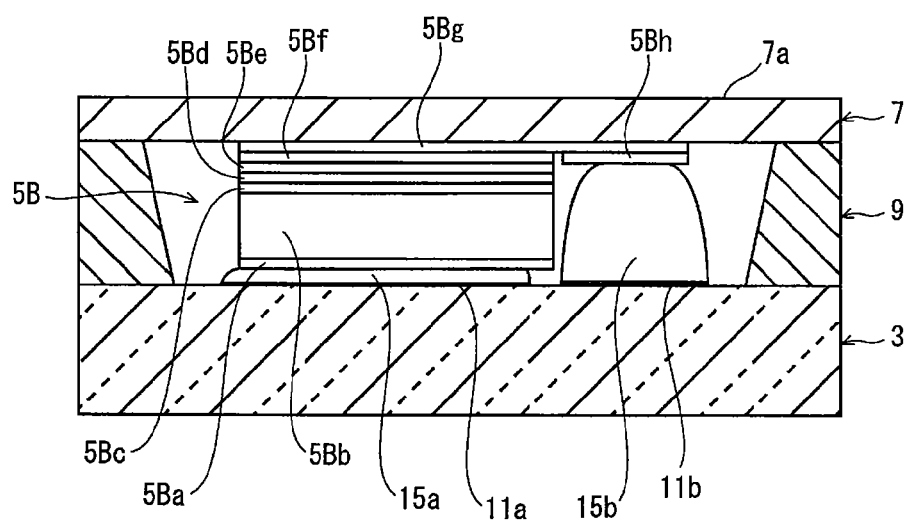
FIG. 3 is a cross-sectional view of the light emitting device relating to the embodiment 1 shown in FIG. 1 taken along a line X-X seen in an arrow direction.

FIG. 3 is a cross-sectional view of the light emitting device 1 shown in FIG. 1 taken along a line X-X seen in an arrow direction.

The LEDs 5A, 5B, 5C, and 5D have the same specifications (structure) with the exception of the manufacturing variation, and accordingly the following description is given on only the LED 5B with reference to FIG. 3.

The LED 5B is a rectangular parallelepiped, and is square shaped when seen in a plan view (here, when seen in a direction perpendicular to the main surface 3a of the substrate 3). The LED 5B is mounted on the main surface 3a of the substrate 3. Here, one of surfaces of the LED 5B, which is mounted on the substrate 3, is a lower surface of the LED 5B, and the other surface of the LED 5B, which is parallel to the substrate 3 and is more distant from the substrate 3 than the one surface, is an upper surface (light emitting surface) of the LED 5B.

The LED 5B is, for example, composed of the following laminated in this order from the lower surface: a (p-type) electrode pattern 5Ba made of AuSn, Au, or the like; a conductive substrate 5Bb made of Si, Ge, or the like; a junction member 5Bc made of AuSn or the like; a highly-reflective member 5Bd made of Ag, Al, Rh, or the like; a P—GaN conductive layer 5Be; an InGaN (MQW-structured) light emitting layer 5Bf; an N—GaN conductive layer 5Bg; and an (n-type) electrode pattern 5Bh made of Au or the like. The LED 5B emits blue light, for example. Note that the conductive layer 5Bg is the light emitting surface of the LED 5B.

The LED 5B is a so-called single-sided electrode type LED, and is mounted on the substrate 3 via bumps 15a and 15b, for example. To be precise, the LED 5B is mounted on the substrate 3 by connecting the electrodes 5Ba and 5Bh of the LED 5B to the lands 11a and 11b of the wiring pattern 11 via the bumps 15a and 15b, respectively.

The wavelength conversion member 7 is made of a material for converting a wavelength of (part of) light emitted from the LED 5, specifically a translucent material containing a phosphor for converting blue light emitted from the LED 5 into yellow light.

As a result, the light emitting device 1 outputs white light (combined light) obtained by performing color-mixing on the blue light emitted from the LED 5 and the yellow light wavelength-converted by the phosphor.

The wavelength conversion member 7 has a surface 7a whose state has been adjusted according to color of light emitted from the LED 5. The surface 7a of the wavelength conversion member 7 is described later.

The fixing frame 9 surrounds the four LEDs 5 as shown in FIG. 1 to FIG. 3, and has a height which is set such that the wavelength conversion member 7 is in contact with the upper surface of each of the LEDs 5.

2. Manufacturing Method

The above light emitting device 1 is manufactured via the following steps: a mounting step of mounting the LED 5 on the substrate 3; a fixing step of fixing the fixing frame 9 on the substrate 3; an attaching step of attaching the wavelength conversion member 7 to the fixing frame 9; a measuring step of measuring optical properties such as color of combined light of light emitted from the wavelength conversion member 7 using light emission from the LED 5 (combined light of light emitted from the LED 5 and wavelength-converted light); and an adjusting step of adjusting, when the measured optical properties are out of a predetermined range, the state of the surface 7a (hereinafter, simply referred to as "surface state") of the wavelength conversion member 7.

The above mounting step, fixing step, attaching step, and measuring step can be performed with use of known arts. Note that color of light as the optical properties is measured with use of an integrating sphere, a chroma meter, and so on.

The adjusting step is performed by changing the surface state of the wavelength conversion member 7. In the present embodiment, the surface state of the wavelength conversion member 7 is changed by changing the finishing state of the surface 7a of the wavelength conversion member 7.

Specifically, the optical properties (color) of light output from the light emitting device 1 is adjusted as follows. In the case where the optical properties (color of light) measured in the measuring step is out of the predetermined range and includes excessive yellow light components, mirror finishing is performed on the surface 7a of the wavelength conversion member 7 (the roughness of the surface 7a is decreased). Also, in the case where the optical properties (color of light) measured in the measuring step is out of the predetermined range and includes excessive blue light components, #220 buffing or the like is performed on the surface 7a of the wavelength conversion member 7 (the roughness of the surface 7a is increased).

By performing mirror finishing on the surface (or a rear surface) of the wavelength conversion member 7 (by decreasing the roughness of the surface (or the rear surface)), the intensity of the yellow components decreases and the intensity of the blue components increases. On the contrary, by performing #220 buffing or the like on the surface of the wavelength conversion member 7 (by increasing the roughness of the surface), the intensity of the blue components decreases and the intensity of the yellow components increases. The details are described later.

The description has been provided on the manufacturing method of the light emitting device 1 based on the assumption that the light emitting device 1 has the above structure. Alternatively, the present invention is applicable to any light emitting device having other structure as long as the measuring step and the adjusting step are performed.

Suppose a case where a light emitting device includes a base, a substrate and a fixing frame that are attached to the base, LEDs mounted on the substrate, and wavelength conversion members fixed to the fixing frame. In such a case, a manufacturing method of this light emitting device includes the following steps: an attaching step of attaching the substrate and the fixing frame to the base; a mounting step of mounting the LEDs on the substrate; an attaching step of attaching each of the wavelength conversion members to the fixing frame; a measuring step of measuring color of combined light of light emitted from the wavelength conversion member resulting from light emission from the LEDs; and an adjusting step of adjusting a surface of the wavelength conversion member in the case where the measured color of light is out of a predetermined range.

Alternatively, the wavelength conversion member may be temporarily attached to the base or the substrate, and then may be permanently attached after the surface state of the wavelength conversion member has been adjusted.

3. Example

The LED 5 includes an InGaN (MQW-structured) light emitting layer, and emits blue light. When seen in a plan view, the LED 5 has a bottom surface whose side is approximately 1 (mm). The distance between each two adjacent LEDs 5 is 100 (μm).

The wavelength conversion member 7 is an inorganic molding having a translucent wavelength conversion layer containing a phosphor material with a garnet crystal structure. The phosphor material contains a constituent element group including at least one selected from the group consisting of Mg, Ca, Sr, Ba, Y, La, Gd, Tb, and Lu. Part of the constituent element group is displaced with $Ce^{3+}$. The wavelength conversion member 7 has a thickness of 120 (μm).

4. Surface State of Wavelength Conversion Member

Conventionally, there has been considered that when buffing, W/E, or the like is performed on a wavelength conversion member, the wavelength conversion member becomes thinner, and this increases the transmissivity of light emitted from the LED, and as a result chromaticity of light emitted from the light emitting device is shifted only towards blue light. However, after various considerations, the present inventors proved that the chromaticity is shifted differently depending on the surface state of the wavelength conversion member. The following describes the surface state and the change in optical properties.

(1) Finishing Surface State of Wavelength Conversion Member (1-1) Experiment

An experiment was performed with respect to the relationship between the surface state of the wavelength conversion member and the optical properties (color) of light output from the light emitting device.

Figure 4A:
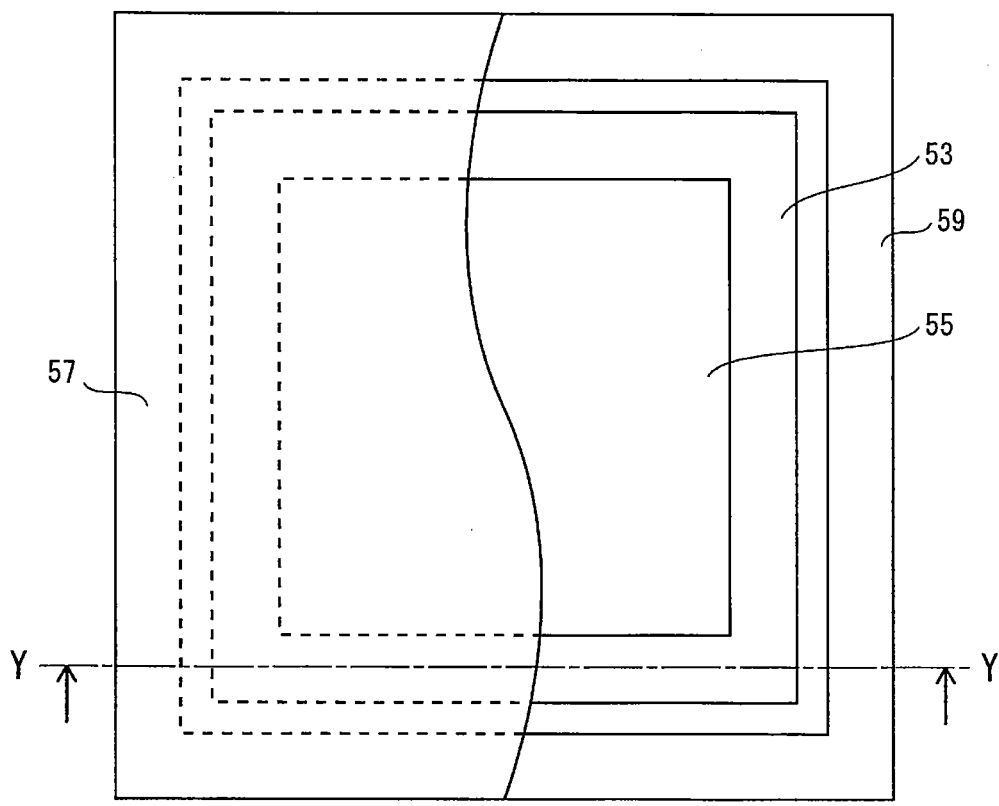
FIG. 4A is a schematic plane view of a light emitting device for testing in which a wavelength conversion member is partially removed for convenience of understanding the internal structure of the light emitting device.
Figure 4B:
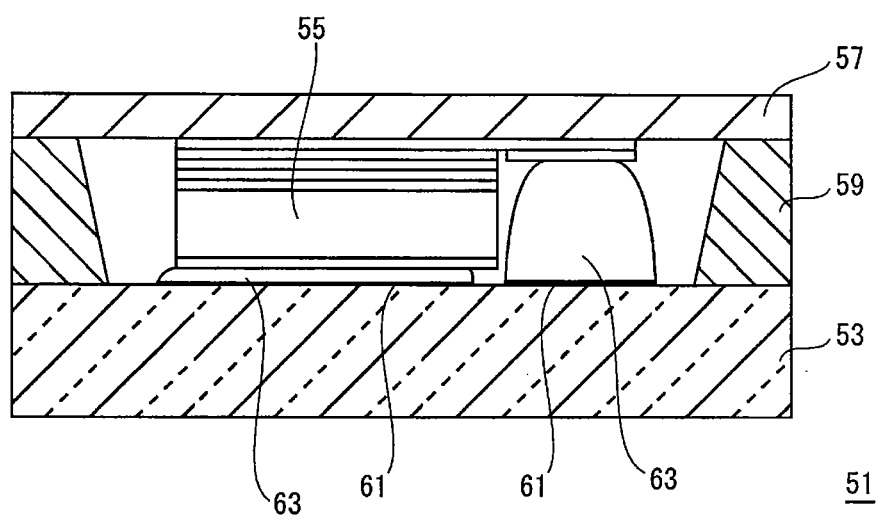
FIG. 4B is a cross-sectional view of the light emitting device shown in FIG. 4A taken along a line Y-Y seen in an arrow direction.

FIG. 4A is a schematic plane view of an experimental light emitting device. In FIG. 4A, for convenience of understanding the internal structure of the light emitting device, a wavelength conversion member is partially removed. FIG. 4B is a cross-sectional view of the light emitting device shown in FIG. 4A taken along a line Y-Y seen in an arrow direction.

A light emitting device 51 includes, as shown in FIG. 4A and FIG. 4B, a substrate 53, an LED 55, a wavelength conversion member 57, and a fixing frame 59. The LED 55 and the wavelength conversion member 57 are made of the same materials as those in the above example, respectively.

The substrate 53 has a wiring pattern 61 formed on a surface thereof. The LED 55 is a single-sided electrode type LED having the structure in which both a p-type electrode and an n-type electrode are formed at a lower surface thereof. The LED 55 is connected to the wiring pattern 61 via respective bumps 63, that is, is mounted on the substrate 53.

The LED 55 is an InGaN element emitting blue light. The wavelength conversion member 57 is composed of a ceramic material (YAG) that is a translucent material and a phosphor material containing a constituent element group that converts part of light emitted from the LED 55 into yellow light.

With this structure, the light emitting device 51 outputs white light obtained by performing color-mixing on blue light emitted from the LED 55 and yellow light wavelength-converted by the wavelength conversion member 57.

The ceramic material of the wavelength conversion member 57 for testing had five types of particle diameter. On each of the five types of particle diameters, four types of surface finishing were performed. That is, 20 types of the ceramic materials were prepared in total for testing.

Specifically, the five types of particle diameter of the ceramic material include 8 (μm), 23 (μm), 30 (μm), 45 (μm), and 60 (μm). Wavelength conversion members each having a different particle diameter are obtained by changing firing conditions of a ceramic material that is a main material of the wavelength conversion member.

Also, the four types of surface finishing include mirror finishing, #220 buffing, wet etching after mirror finishing, and wet etching after #220 buffing.

Note that wet etching is hereinafter also referred to as "W/E". Wet etching is performed with use of sulfuric acid (96%) as an etching solution under etching conditions of three hours at a temperature of 150 (° C.).

FIG. 5 to FIG. 9 each show the surface state of a wavelength conversion member having a different type of particle diameter after each type of surface finishing has been performed.

Specifically, FIG. 5 shows the surface state of a wavelength conversion member having a particle diameter of 8 (μm) after each type of surface finishing has been performed. FIG. 6 shows the surface state of a wavelength conversion member having a particle diameter of 23 (μm) after each type of surface finishing has been performed. FIG. 7 shows the surface state of a wavelength conversion member having a particle diameter of 30 (μm) after each type of surface finishing has been performed. FIG. 8 shows the surface state of a wavelength conversion member having a particle diameter of 45 (μm) after each type of surface finishing has been performed. FIG. 9 shows the surface state of a wavelength conversion member having a particle diameter of 60 (μm) after each type of surface finishing has been performed.

The wavelength conversion members shown in FIG. 5 to FIG. 9 each have a surface state and shape where at least part of particle boundaries are exposed on a surface of the wavelength conversion member. The exposed particle boundaries are oriented in irregular directions. This is considered to result in uniform light dispersion and emission.

FIG. 10 to FIG. 13 each show spectra of light emitting devices each using a wavelength conversion member having a different surface state. Note that the spectrum represents a distribution of wavelength of light and light emitting intensity at the wavelength. In the present experiment, the spectrum is measured with use of an integrating sphere.

Figure 10:
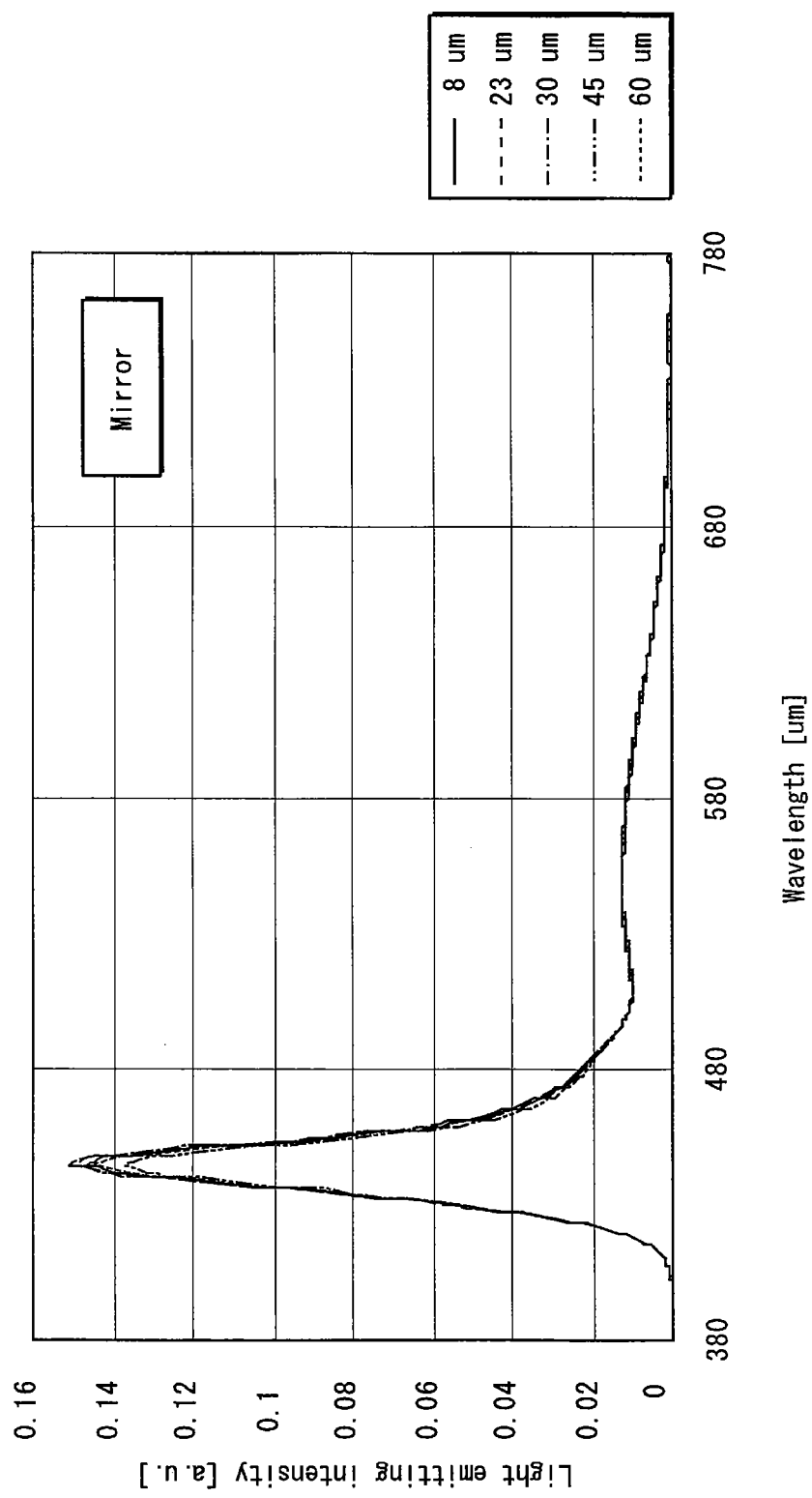
FIG. 10 shows spectra of light emitting devices each using a wavelength conversion member on which mirror finishing has been performed.
Figure 11:
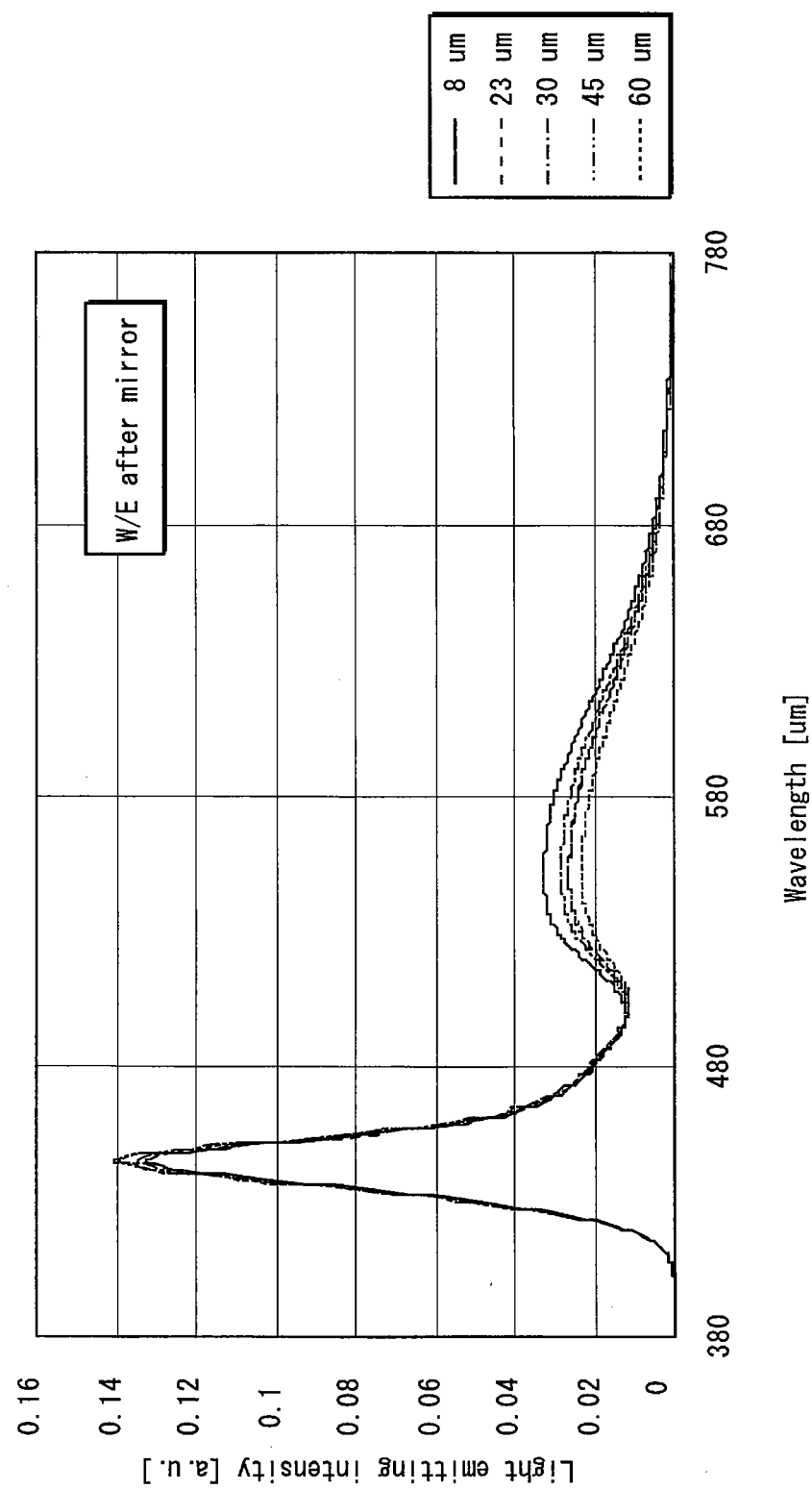
FIG. 11 shows a spectrum of a light emitting device using a wavelength conversion member on which W/E has been performed after mirror finishing.
Figure 12:
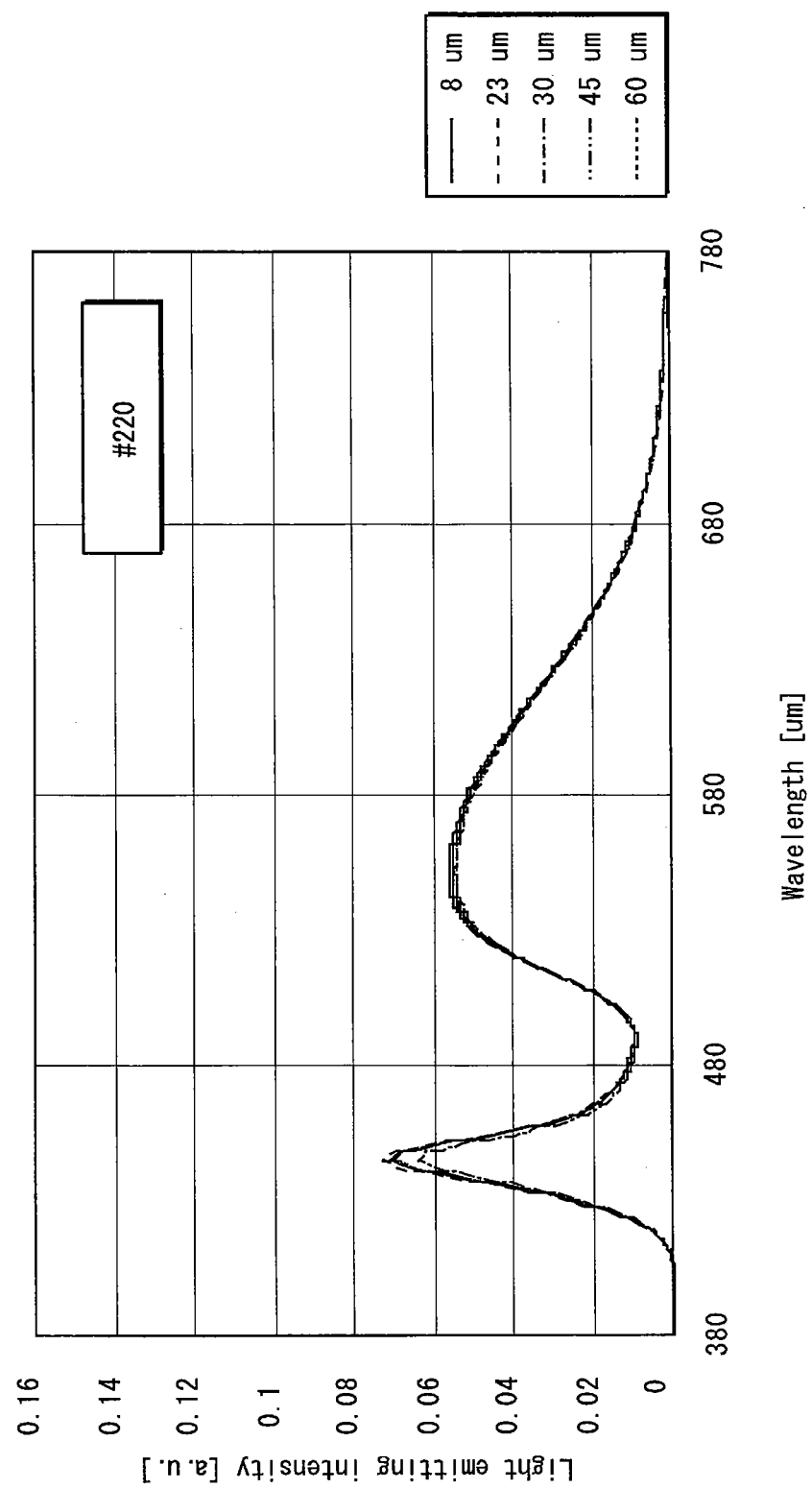
FIG. 12 shows a spectrum of a light emitting device using a wavelength conversion member on which #220 buffing has been performed.
Figure 13:
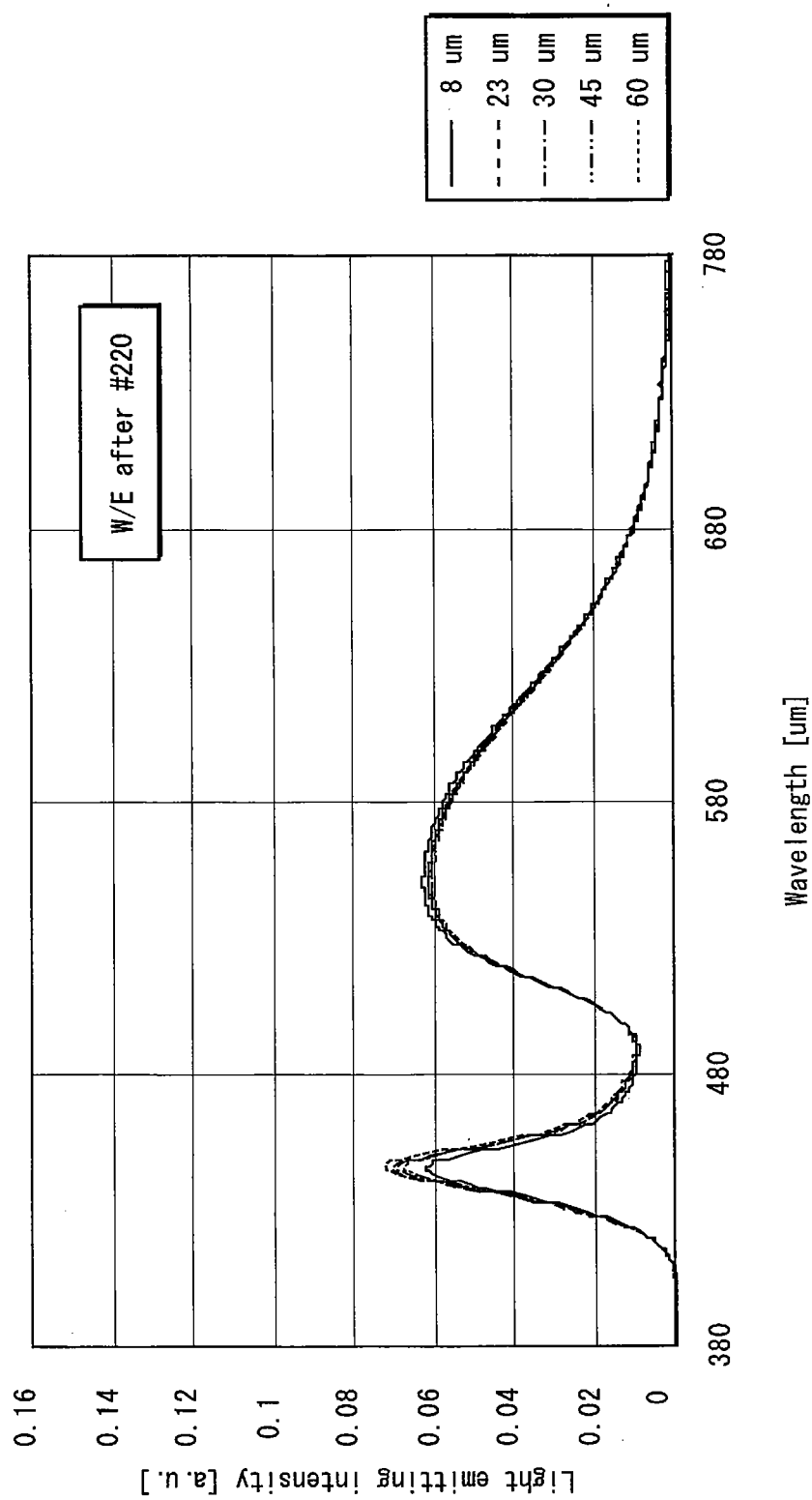
FIG. 13 shows a spectrum of a light emitting device using a wavelength conversion member on which W/E has been performed after #220 buffing.

Specifically, FIG. 10 shows spectra of light emitting devices each using a wavelength conversion member on which mirror finishing has been performed. FIG. 11 shows spectra of light emitting devices each using a wavelength conversion member on which W/E has been performed after minor finishing. FIG. 12 shows spectra of light emitting devices each using a wavelength conversion member on which #220 buffing has been performed. FIG. 13 shows spectra of light emitting devices each using a wavelength conversion member on which W/E has been performed after #220 buffing.

FIG. 10 to FIG. 13 demonstrate the following.

Wavelength conversion members having the same surface state result in substantially the same spectra, irrespective of the particle diameter of the wavelength conversion member. Specifically, in the case where mirror finishing is performed on each wavelength conversion member as shown in FIG. 10 for example, the light emitting intensity of light emitted from each wavelength conversion member has a peak at a wavelength of approximately 440 (nm) and the similar spectra were observed, irrespective of the particle diameter of the wavelength conversion member. Also, in the case where a ceramic material is used for the wavelength conversion members, the spectra of light output from the light emitting devices greatly depend on the surface state, irrespective of the particle diameter of the ceramic material.

Here, comparison was made between the state of the surface on which mirror finishing has been performed (FIG. 10) and the state of the surface on which #220 buffing has been performed (FIG. 12). The following was observed by the comparison: #220 buffing makes the surface more rough (more concavo-convex) than mirror finishing; #220 buffing makes the intensity of light emitted from the LED (light at a wavelength of approximately 440 (nm)) lower than mirror finishing; and on the contrary, #220 buffing makes the intensity of light wavelength-converted by the wavelength conversion member (light at a wavelength of approximately 550 (nm)) higher than mirror finishing.

Similarly, comparison was made between the surface on which mirror finishing has been performed (FIG. 10) and the surface on which W/E has been performed after mirror finishing (FIG. 11). Furthermore, comparison was made between the surface on which #220 buffing has been performed (FIG. 12) and the surface on which W/E has been performed after #220 buffing (FIG. 13).

The following was observed by the comparison between only the mirror finishing (FIG. 10) and the W/E after the mirror finishing (FIG. 11): W/E after mirror finishing makes the intensity of light emitted from the LED (light at a wavelength of approximately 440 (nm)) slightly lower than only the mirror finishing; and on the contrary, W/E after mirror finishing makes the intensity of light wavelength-converted by the wavelength conversion member (light at a wavelength of approximately 550 (nm)) slightly higher than only mirror finishing.

Furthermore, the following was observed by comparison between only #220 buffing (FIG. 12) and W/E after #220 buffing (FIG. 13): W/E after #220 buffing makes the intensity of wavelength-converted light slightly higher than only #220 buffing. However, this change is small compared with the change between only mirror finishing and W/E after mirror finishing.

Figure 14:
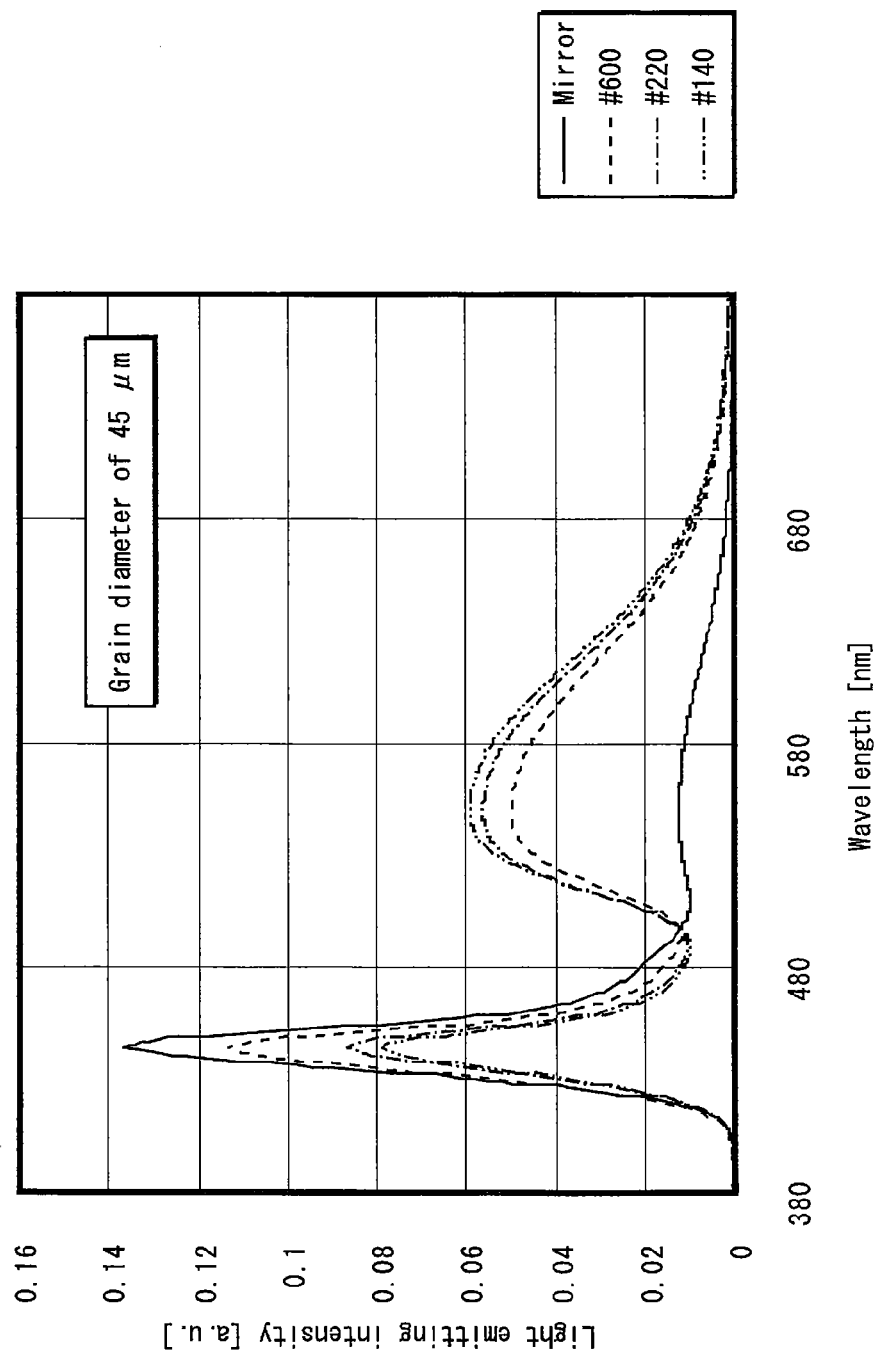
FIG. 14 shows spectra of wavelength conversion members each having a particle diameter of 45 (μm) and a different surface state.

FIG. 14 shows spectra of wavelength conversion members each having a particle diameter of 45 (μm) and a different surface state.

As shown in FIG. 14, in the case where wavelength conversion member having the same particle diameter (here, particle diameter of 45 (μm)) is used, the intensity of light emitted from the LED (light at a wavelength of approximately 440 (nm)) decreases in the following order of mirror finishing, #600 buffing, #220 buffing, and #140 buffing. On the contrary, the intensity of light wavelength-converted by the wavelength conversion member (light at a wavelength of approximately 550 (nm)) increases in this order.

Figure 15:
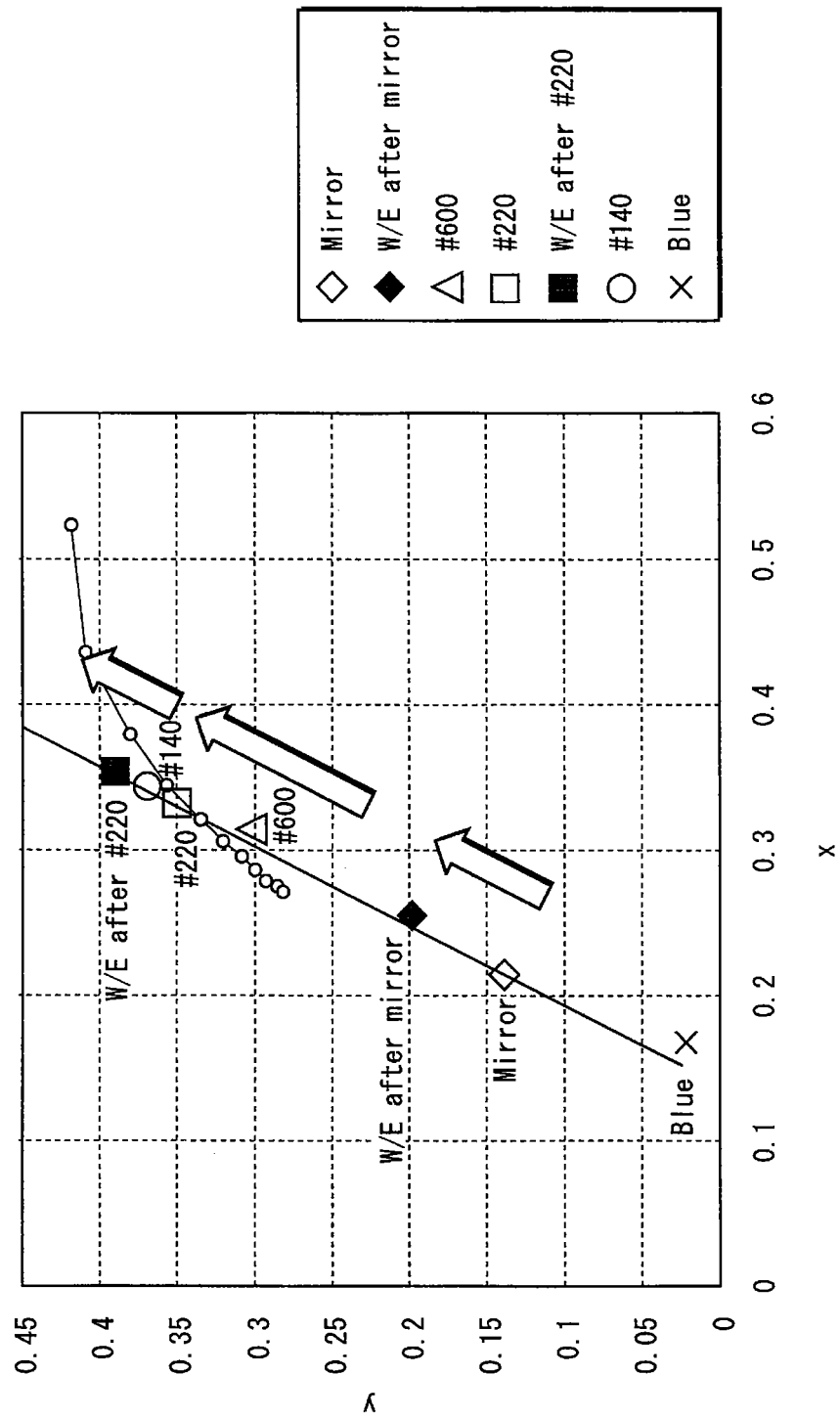
FIG. 15 is a chromaticity coordinate diagram showing chromaticity of light output from light emitting devices each using a wavelength conversion member having a particle diameter of 45 (μm) and on which a different type of surface finishing has been performed.

FIG. 15 is a chromaticity coordinate diagram showing chromaticity of light output from light emitting devices each using a wavelength conversion member having a particle diameter of 45 (μm) and on which a different type of surface finishing has been performed.

As shown in FIG. 15, a tendency was observed that the chromaticity of the output light is shifted closer to blue light in an ascending order of W/E after #220 buffing, #140 buffing, #220 buffing, #600 buffing, W/E after mirror finishing, and minor finishing.

On the contrary, a tendency was observed that the chromaticity of the output light is shifted closer to yellow light in an ascending order minor finishing, W/E after minor finishing, #600 buffing, #220 buffing, #140 buffing, and W/E after #220 buffing. Note that a point indicated by a word "Blue" in FIG. 15 denotes blue light emitted from the LED.

Especially, a tendency was observed that, except for W/E after mirror finishing and W/E after #220 buffing, the chromaticity of the output light is shifted closer to blue light in an ascending order of #140 buffing, #220 buffing, #600 buffing, and mirror finishing. This proves that the smaller the particle size of a grind stone is, the closer the chromaticity is shifted to yellow light, and the greater the particle size of a grind stone is, the closer the chromaticity is shifted to blue light.

Also, it was observed that, except for W/E after mirror finishing and W/E after #220 buffing, the surface state (particle size of grind stone) and chromaticity of light output from a light emitting device that includes a wavelength conversion member having a different surface state are plotted on a substantially straight line, as shown in FIG. 15.

As described above, in the case where the wavelength conversion member having the same particle diameter is used, the chromaticity of light emitted from the LED is shifted from blue light to yellow light in an ascending order of mirror finishing, #600 buffing, #220 buffing, and #140 buffing. This proves that it is possible to shift the chromaticity of light emitted from the LED by changing the surface state.

FIG. 16 shows, using chromaticity coordinate values, the chromaticity of light output from light emitting devices each using a wavelength conversion member having a different particle diameter and a different surface state. Note that the surface state is simply denoted as "state" in FIG. 16.

Although the chromaticity shown in FIG. 16 is not plotted on the chromaticity coordinate, it is found that chromaticity of light emitted from the LED is shifted by changing the surface state as long as the wavelength conversion member has the same particle diameter.

Figure 17:
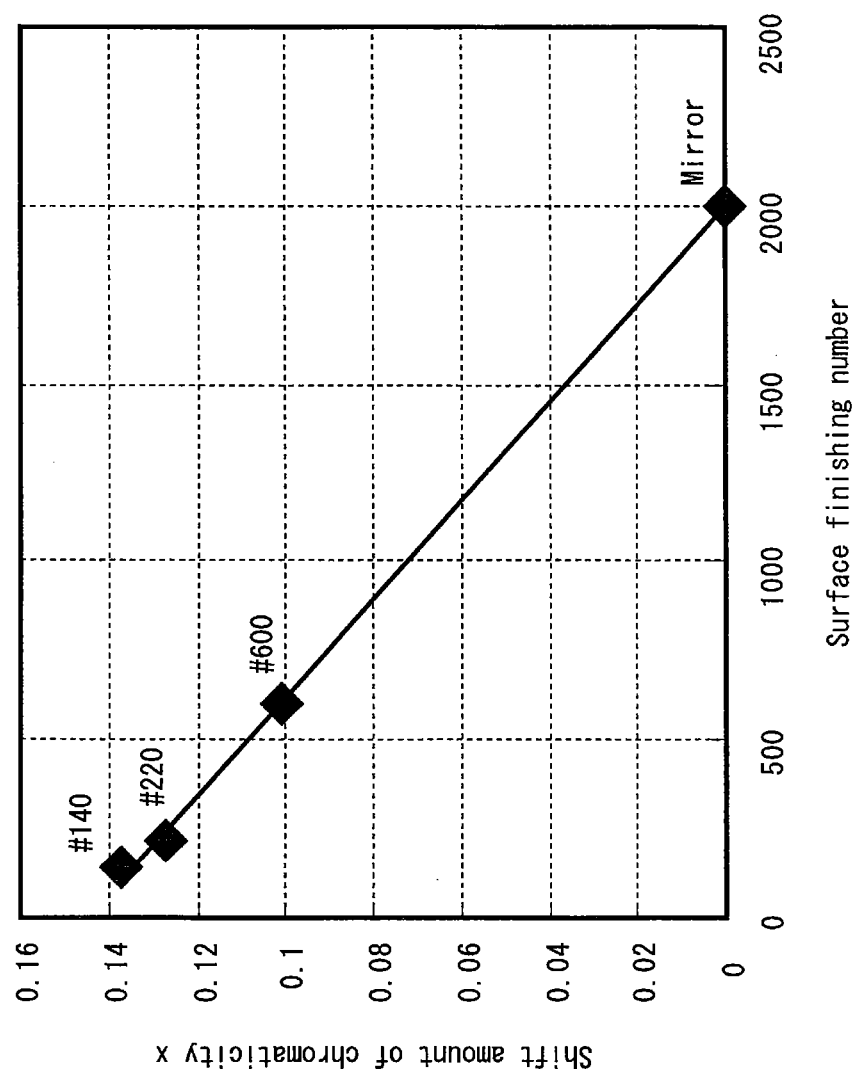
FIG. 17 shows the relationship between surface finishing number of the wavelength conversion member and shift amount of the chromaticity x.

FIG. 17 shows the relationship between the surface finishing number of the wavelength conversion member and the shift amount of the chromaticity x. Note that the "surface finishing number" represents a value indicating the particle size of a grind stone on which buffing step has been performed. For example, #220 buffing is represented by a surface finishing number "220", and mirror finishing is represented by a surface finishing number "2000".

FIG. 17 shows the shift amount of measured chromaticity of light output from light emitting devices each using a wavelength conversion member having a different surface state. Here, the measurement is performed with reference to the chromaticity of light output from the light emitting device using the wavelength conversion member on which mirror finishing has been performed (surface finishing number of "2000").

Here, the chromaticity x and the chromaticity y are linearly related to each other on the chromaticity coordinate, as shown in FIG. 15. For example, when the shift amount of the chromaticity x increases, the shift amount of the chromaticity on the chromaticity coordinate inevitably increases. As a result, only with the shift amount of the chromaticity x, it is possible to evaluate the influence of chromaticity due to the difference in surface state of the wavelength conversion member (surface finishing number). Accordingly, in FIG. 17, the shift amount of the chromaticity x is used as the shift amount of the chromaticity.

As shown in FIG. 17, on the basis of the chromaticity of light output from the light emitting device using the wavelength conversion member on which mirror finishing has been performed, there is found a linear relationship diagonally right down on the chromaticity coordinate among the shift amounts of chromaticity of light output from light emitting devices each using a wavelength conversion member having a different surface state. This demonstrates that as the surface finishing number decreases, that is, as the surface state becomes more rough, the shift amount of the chromaticity x increases.

Figure 18:
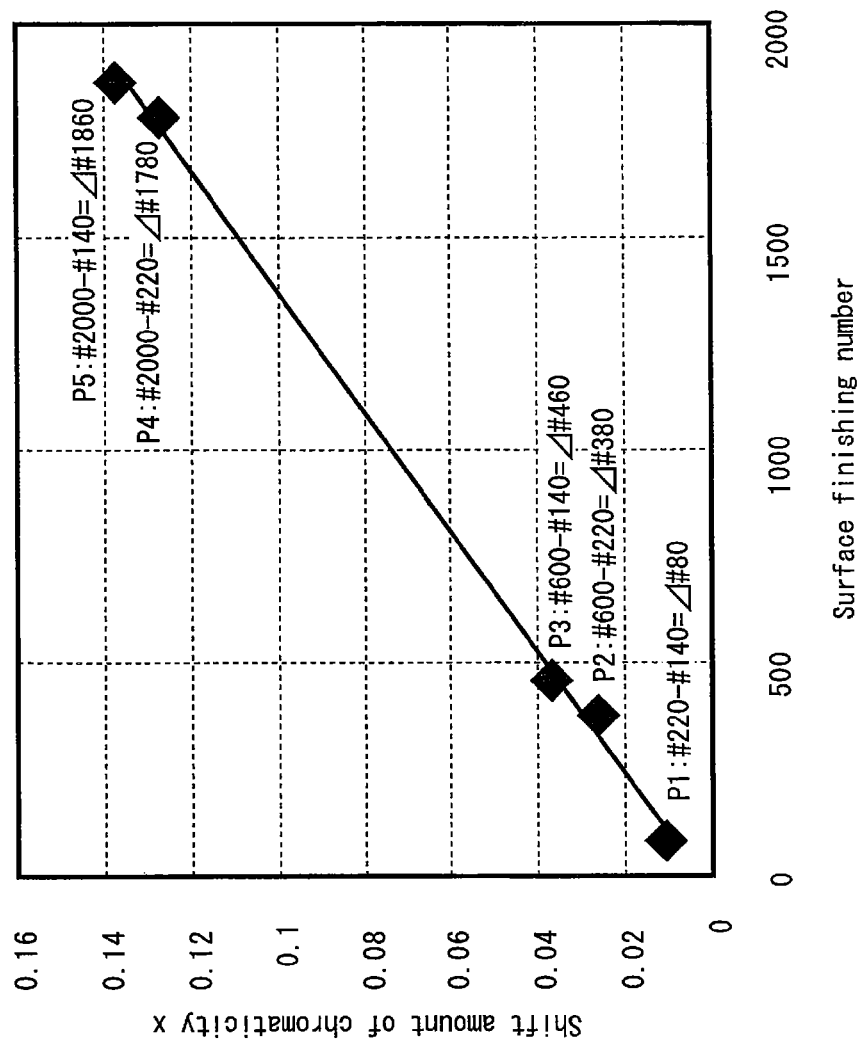
FIG. 18 shows the relationship between surface finishing number of the wavelength conversion member and shift amount of the chromaticity x.

FIG. 18 shows the relationship between the surface finishing number of the wavelength conversion member and the shift amount of the chromaticity x.

In FIG. 18, the relationship is shown between the difference, which occurs when the surface state is changed from a first surface state to a second surface state, and the shift amount of the chromaticity x.

Specifically, in FIG. 18, the value "P1" indicates that there is a difference of approximately 0.01 in the chromaticity x between the surface state after undergoing #220 buffing (first surface state) and the surface state after undergoing #140 buffing (second surface state).

In this way, when the surface state is changed, as the difference in surface states increases, the shift amount of the chromaticity of light increases. For example, in the case where buffing is performed, as the difference in particle size of a grind stone (surface finishing number) increases, the shift amount of the chromaticity of light increases.

Accordingly, if it is possible to know the current surface state of the wavelength conversion member and the shift amount necessary for shifting, to a desired chromaticity, the chromaticity of light output from a light emitting device that includes the wavelength conversion member having this current surface state, it is possible to find a surface state of a wavelength conversion member of a light emitting device that outputs light having the desired chromaticity. Accordingly, it is possible to find a surface state to which the current surface state is to be adjusted (surface finishing number to which the current surface finishing number is to be changed, for example).

Figures 19A, 19B:
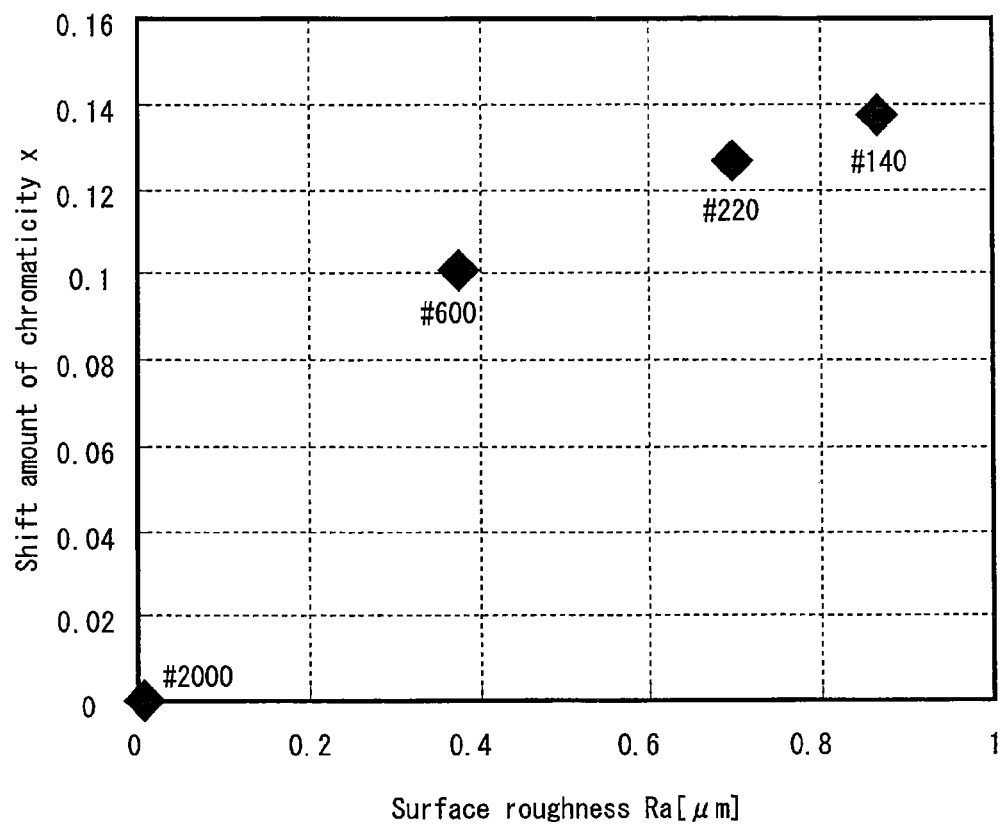
FIG. 19A shows the surface roughness of a surface corresponding to each surface finishing number.
FIG. 19B shows the relationship between surface roughness and shift amount of the chromaticity x.

FIG. 19A shows the surface roughness of a surface corresponding to each surface finishing number. FIG. 19B shows the relationship between the surface roughness and the shift amount of the chromaticity x.

As shown in FIG. 19B, as the surface roughness increases, that is, as the surface state becomes more rough, the shift amount of the chromaticity x increases.

(1-2) Specific Examples

The above experimental results prove that it is possible to change the optical properties of light output from the light emitting devices (1, 51), by changing the surface state of the wavelength conversion members (7, 57).

The following describes a light emitting device outputting light whose optical properties have been adjusted based on the above experimental results.

Figure 20A:
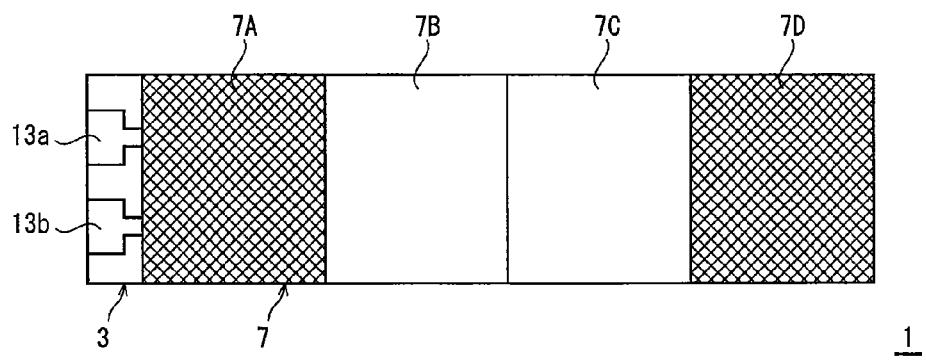
FIG. 20A and FIG. 20B each show an example of a light emitting device whose optical properties have been adjusted.
Figure 20B:
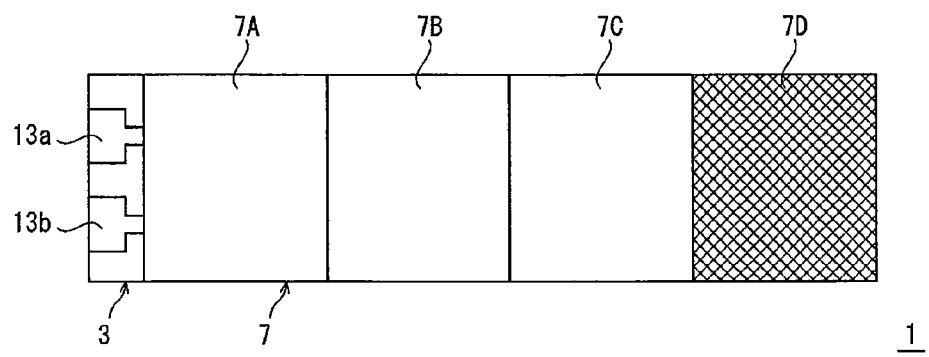

FIG. 20A and FIG. 20B each show an example of a light emitting device whose optical properties have been adjusted.

In FIG. 20A and FIG. 20B, the light emitting device 1 is used as an example. The light emitting device 1 has four LEDs 5 in line. The direction in which the LEDs 5 are arranged is the column direction. Also, the wavelength conversion member 7 covers all of the LEDs 5A, 5B, 5C, and 5D. In FIG. 20A and FIG. 20B, respective regions of the wavelength conversion member 7 that are positioned above the LEDs 5A, 5B, 5C, and 5D are shown as regions 7A, 7B, 7C, and 7D.

In FIG. 20A, the light emitting device 1 has provided on a surface thereof the wavelength conversion member 7 whose regions at the both ends on the surface (both ends in the column direction) have been adjusted. In other words, the regions 7A and 7D of the wavelength conversion member 7, which are positioned above the LEDs 5A and 5D at the ends, respectively, have been finished to a mirrored-surface.

This is an improvement example of a case where white light whose chromaticity has been shifted to yellow light is output from the regions at ends on the light output surface of the light emitting device 1 (the surface 7a of the wavelength conversion member 7).

Such a case occurs when yellow light is excessively contained. Specifically, in the end part of each of the regions 7A and 7D that are positioned above the LEDs 5A and 5D respectively at the ends on the light output surface, no light is incident in a direction perpendicular to the wavelength conversion member 7, and light is incident only in a direction oblique to the wavelength conversion member 7, and this results in excessive yellow light.

In order to improve this case, mirror finishing is performed on the regions 7A and 7D at the ends of the wavelength conversion member 7. This decreases the intensity of yellow light at the ends on the light output surface of the light emitting device 1, and as a result desired white light can be output as a whole.

In FIG. 20B, the light emitting device 1 has the wavelength conversion member 7 whose one region at the end (region 7D) on the surface has been adjusted. In other words, the region 7D of the wavelength conversion member 7, which is positioned above the LED 5D at one end (opposite to the feed terminals 13a and 13b), has been finished to rough.

This is an improvement example of a case where white light whose chromaticity has been shifted to blue light is output from the region at one end on the light output surface of the light emitting device 1. Such a case occurs when the LED 5D at the end emits blue light greater in amount (intensity) than other three LEDs.

In order to improve this case, finishing is more roughly performed on the region 7D at the end of the wavelength conversion member 7 than other three regions. This decreases the intensity of blue light at the end on the light output surface of the light emitting device 1, and as a result desired white light can be output as a whole.

As described above, in the case where light output from the light emitting device 1 is out of the required range of color of light (that is, the light emitting device 1 is below the standard), the surface state of the wavelength conversion member 7 is changed. This can adjust the optical properties of light output from the light emitting device 1, and furthermore reduce the color unevenness.

Furthermore, as shown in FIG. 20B, in the case where the light emitting device 1 has the light output surface in which color of light differs between regions, it is possible to suppress the color unevenness on the light output surface by adjusting the surface state of part or all of the surface of the wavelength conversion member 7.

(2) Surface Shape of Wavelength Conversion Member

An experiment was performed with respect to the relationship between the surface shape of the wavelength conversion member 7 and the optical properties of light output from the light emitting device.

Figure 21:
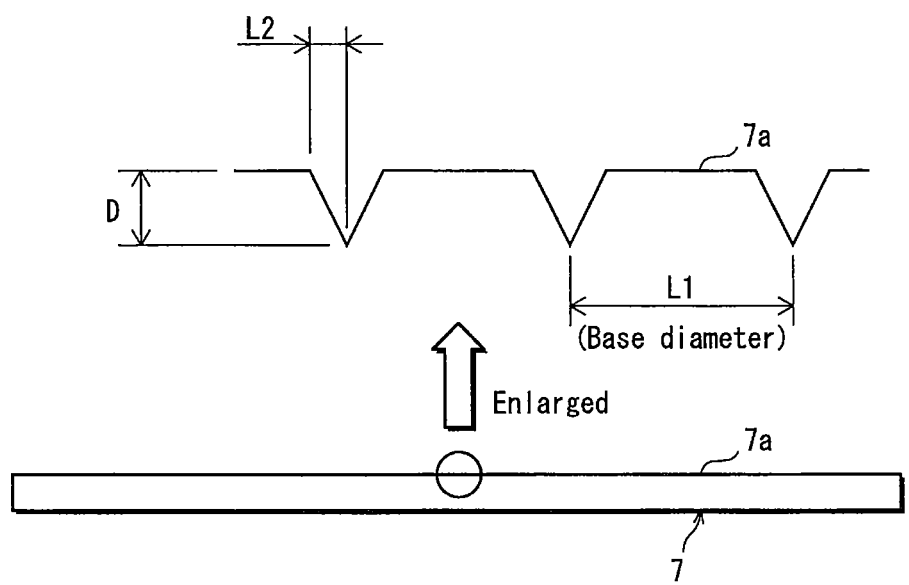
FIG. 21 is a schematic view of a surface shape of a wavelength conversion member for testing.

FIG. 21 is a schematic view of a surface shape of a wavelength conversion member for testing.

The wavelength conversion member 7 has a concavo-convex surface. The cross section of the concavo-convex surface is a trapezoid such as shown in an enlarged view shown in FIG. 21. In other words, the wavelength conversion member 7 has a V-shaped groove on its surface.

The surface of the wavelength conversion member 7 shown in FIG. 21 is obtained by preparing a ceramic material (containing phosphor material) having different types of particle diameters, performing mirror finishing on a surface of the ceramic material, and then performing wet etching on the surface. That is, etching is performed on the particle boundary of the ceramic material whose surface has been mirror-finished, in the thickness direction of the wavelength conversion member 7. This results in a trapezoidal cross section of the concavo-convex surface such as shown in FIG. 21 (etching is performed on the particle boundary, and thereby forming a V-shaped groove on the surface).

In FIG. 21, the sign "L1" represents the base diameter that is the diameter of the side of the trapezoid, namely, the particle diameter, and the sign "D" represents the height of the trapezoid, namely, the etching depth (hereinafter, simply referred to as "depth"). Note that the depth D and the etching width (twice as long as L2) are adjusted by adjusting the etching period.

The wavelength conversion member 7 has four types of particle diameter of 8 (μm), 23 (μm), 45 (μm), and 60 (μm).

Figure 22:
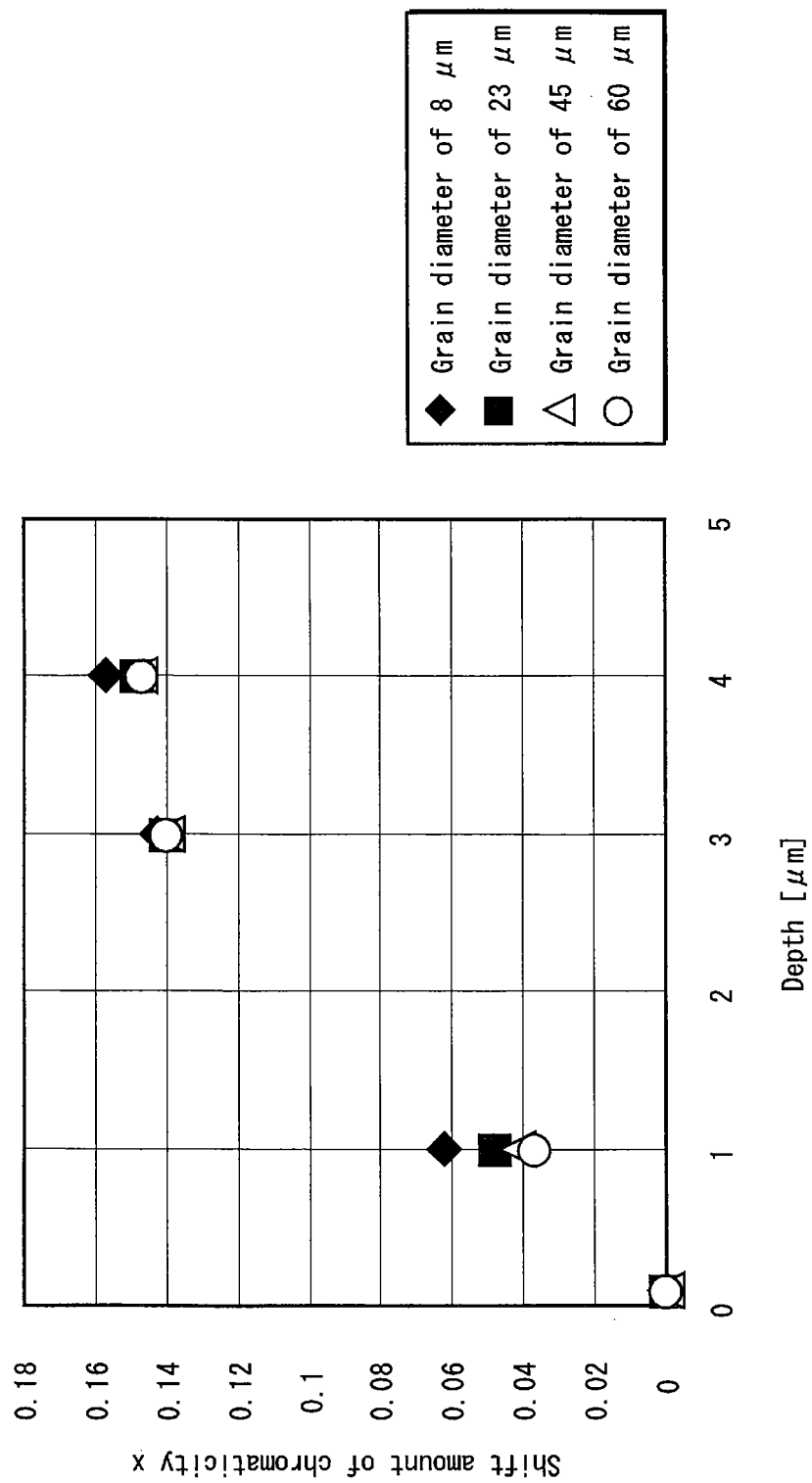
FIG. 22 shows the relationship between groove depth and shift amount of chromaticity.

FIG. 22 shows the relationship between the depth and the shift amount of chromaticity.

As shown in FIG. 22, as the depth D increases, the shift amount of the chromaticity x increases. Furthermore, when the depth D is the same, the shift amount of the chromaticity x is substantially the same, irrespective of particle diameter.

The reason why the description uses the shift amount of the chromaticity x is the same as that given on FIG. 17.

Figure 23:
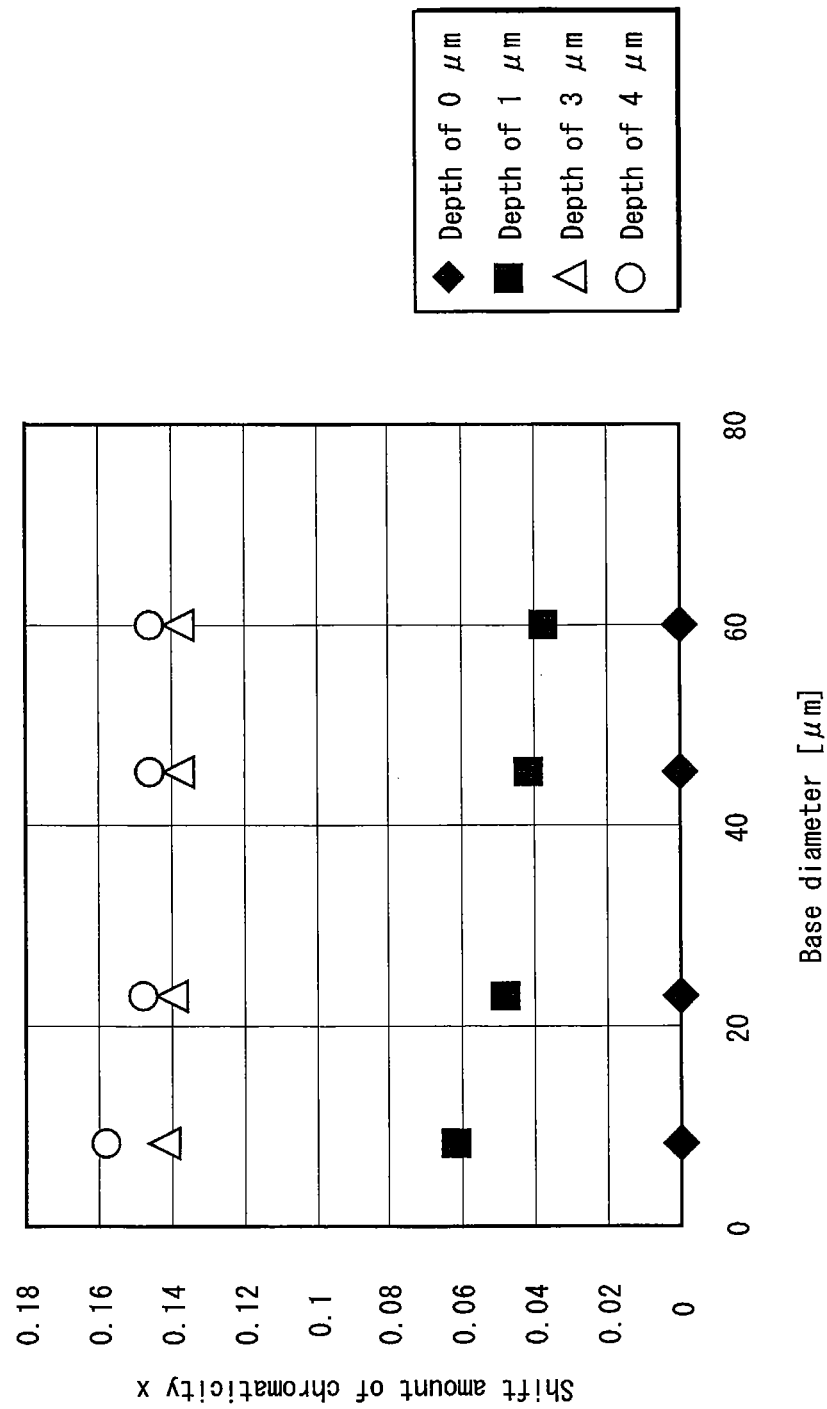
FIG. 23 shows the relationship between base diameter and shift amount of chromaticity.

FIG. 23 shows the relationship between the base diameter and the shift amount of chromaticity.

As shown in FIG. 23, when the base diameter L1 is the same (23 (μm), for example), as the depth D increases (from (0 (μm) to 4 (μm)), the shift amount of the chromaticity x increases. Furthermore, as the base diameter L1 decreases, the shift amount of the chromaticity x increases with respect to the depth D.

Also, when the depth D is the same (3 (μm), for example), as the base diameter L1 decreases, the shift amount of the chromaticity x increases. However, after the base diameter L1 increases beyond around 60 (μm), the shift amount of the chromaticity x does not change very much.

In view of the above, as the particle diameter of the ceramic material decreases, the shift amount of the chromaticity increases. In order to efficiently adjust the optical properties (color of light), the base diameter L1 is preferably 60 (μm) or less. As seen from FIG. 21, the base diameter represents a pitch of the concavo-convex shape.

Also, although the smallest particle diameter shown in FIG. 23 is 8 (μm), it is preferable to use the base diameter L1 smaller than 8 (μm), because this allows efficient adjustment of the optical properties.

Also, the depth D that is also the height of the base is preferably large as much as possible within a range of 4 (μm) or less. As shown in FIG. 23, there is a small change in shift amount of the chromaticity between the depth D of 3 (μm) and 4 (μm). In view of this, by increasing the depth D to be greater than 4 (μm), the chromaticity is shifted even if the shift amount is small. Accordingly, as the depth D increases beyond the range of 4 (μm) or less, the adjustable range of chromaticity increases.

Embodiment 2

The embodiment 1 has described the light emitting device 1 including four LEDs 5A, 5B, 5C, and 5D. A light emitting device using a single LED also has a problem such as color unevenness on its light output surface and output of light of a undesired color depending on an LED to be used.

An embodiment 2 describes a light emitting device using a single LED, with use of the light emitting device 51 shown in FIG. 4.

Figure 24A:
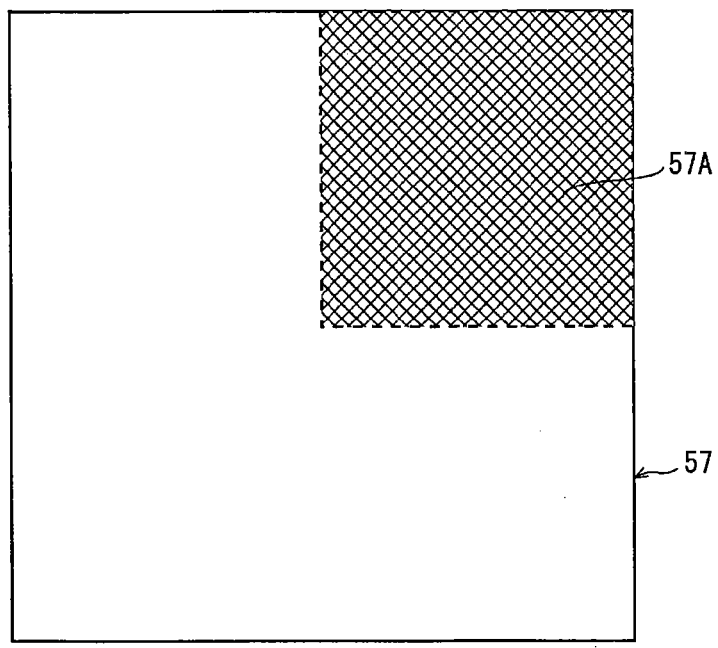
FIG. 24A shows a surface status of a wavelength conversion member relating to an embodiment 2 in the case where color unevenness has partially occurred on a light output surface.
Figure 24B:
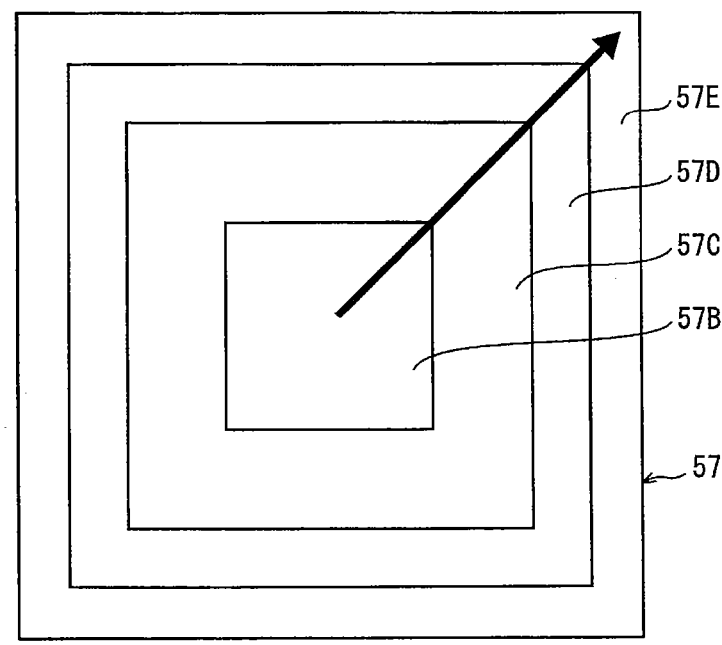
FIG. 24B shows the surface state of the wavelength conversion member after color of light has been adjusted.

FIG. 24A shows a surface status of a wavelength conversion member relating to the embodiment 2 in the case where color unevenness has partially occurred on a light output surface. FIG. 24B shows the surface state of the wavelength conversion member after color of light has been adjusted.

In FIG. 24A, the light output surface has a region (a cross-hatched region on the upper right in the figure) that differs in surface state from other remaining regions.

Specifically, in the case where the LED has an electrode at one corner on its upper surface, there is observed a shift to yellow light with respect to color of light output from a region 57A at one corner on the light output surface of the wavelength conversion member 57 (that is a corner corresponding to the one corner on the upper surface of the LED).

In such a case, as shown in FIG. 24A, the surface of the region 57A on which color unevenness has occurred is made closer to a mirrored surface (by reducing the roughness), it is possible to reduce yellow light and increase blue light on the region 57A. This results in suppression of the color unevenness.

In FIG. 24B, the surface state of the light output surface is changed from the central region toward the peripheral region.

Specifically, in the case where there observed a distribution of blue light on the light emitting surface of the LED 55 where the blue light decreases from the central region toward the peripheral region, light output from the light output surface of the light emitting device 51 decreases in blue light from the central region toward the peripheral region. As a result, light of a desired color cannot be output as a whole.

In such a case, as shown in FIG. 24B, the surface of the wavelength conversion member 57 is made closer to a mirrored surface as the distance increases from a region 57B, which corresponds to the central region on the light output surface of the light emitting device 51, to its peripheral regions 57C, 57D, and 57E. This can reduce the ratio of yellow light in the peripheral regions to suppress the color unevenness. Furthermore, it is possible to approximate to light of a desired color.

Modification Examples

Although the present invention has been described based on the embodiments and so on, the present invention is of course not limited to the specific examples shown in the embodiments and so on. The present invention includes modification examples as shown below, for example.

1. Light Emitting Source

In the embodiments and so on, as a light emitting source, light emitting elements typified by LEDs are used. Alternatively, the light source may be a low-pressure mercury lamp including a glass tube that has an inner surface to which a phosphor material has not been applied. Further alternatively, the light emitting source may be a high-pressure lamp, a light bulb, or the like.

2. Light Emitting Elements (1) Type

In the embodiments and so on, as the light emitting elements, LEDs that are semiconductor light emitting elements are used. Alternatively, other type of semiconductor light emitting elements may be employed. Specifically, laser diodes (LDs) may be employed.

(2) Electrode

In the embodiments and so on, the single-sided electrode type LED is used. Alternatively, a double-sided electrode type LED may of course be employed. In such a case, an electrode provided on the upper surface of the LED is connected to a wiring pattern provided on the substrate via a wire or the like.

(3) Light Emitting Layer

In the embodiments and so on, as the LED having a blue light emitting layer, InGaN elements are used. Alternatively, an LED having other type of light emitting layer may of course be employed.

(4) Number

The light emitting device relating to the embodiment 1 is structured using four LEDs. The light emitting device relating to the embodiment 2 is structured using a single LED. Alternatively, the number of light emitting elements (LEDs) for use in the light emitting device may be one or plural. Note that a modification example on the number of LEDs is described later in the section of light emitting device.

3. Wavelength Conversion Member (1) Number

The light emitting device 1 relating to the embodiment 1 includes the single wavelength conversion member 7, and the light emitting device relating to the embodiment 2 includes the single wavelength conversion member 57. Alternatively, these light emitting devices may each include a plurality of wavelength conversion members.

The following describes modification examples 1 and 2 each relating to a light emitting device including two or more wavelength conversion members.

Figure 25:
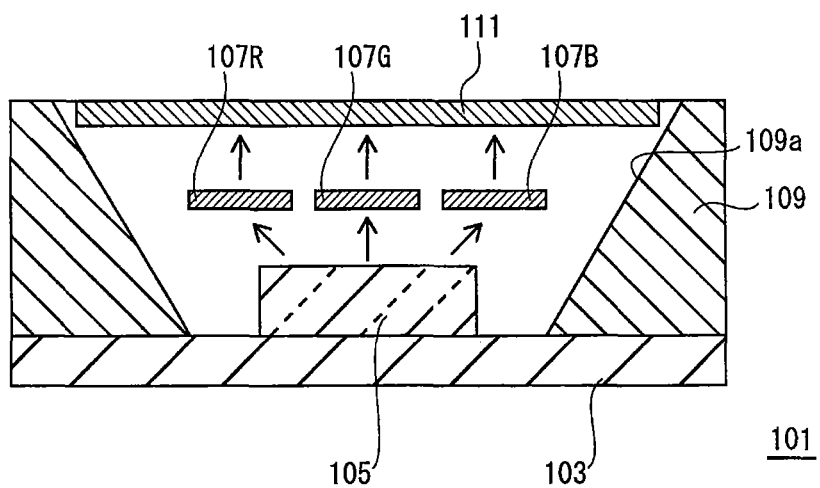
FIG. 25 is a schematic view of a light emitting device relating to a modification example 1.

FIG. 25 is a schematic view of the light emitting device relating to the modification example 1.

A light emitting device 101 relating to the modification example 1 includes a substrate 103, a single LED 105, a plurality of types (three types, here) of wavelength conversion members 107R, 107G, and 107B, a reflector 109 for reflecting wavelength-converted light in a predetermined direction, and a diffuser panel 111 for performing color-mixing on wavelength-converted light. The modification example 1 differs from the embodiment 1 and so on in that a plurality of types of wavelength conversion members 107R, 107G, and 107B are included in the light emitting device.

The LED 105 emits violet light, near-ultraviolet light, ultraviolet light, and so on. The LED 105 has an epitaxially-grown light emitting layer on a substrate made of sapphire, SiC, GaN, Si, GaAs, or the like. The light emitting layer is composed of a semiconductor multilayer film made of a crystal-grown III-V nitride semiconductor (generally expressed as "BAlGaInNAsP", and is hereinafter referred to as "GaN semiconductor"), which is represented by the following general expression: $B_zAl_xGa_{1-x-y-z}In_yN_{1-v-w}As_vP_w$ ($0 \leq x \leq 1$, $0 \leq y \leq 1$, $0 \leq z \leq 1$, $0 \leq x+y+z0 \leq 1$, $0 \leq v0 \leq 1$, $0 \leq w0 \leq 1$, and $0 \leq v+w0 \leq 1$).

The LED 105 emits light via current application to the semiconductor multilayer film. GaN semiconductor materials are known as materials emitting light in a wide range of 200 (nm) in ultraviolet region to 1700 (nm) in infrared region depending on the composition.

The LED 105 may have the following structures, for example: a structure in which light emitting elements, which have been epitaxially-grown on a substrate made of sapphire, SiC, GaN, Si, GaAs, or the like, are arranged on a base; a structure in which the substrate on which light emitting elements have been epitaxially-grown is removed, and only the light emitting elements are arranged on the substrate; and a structure in which the substrate for growth doubles as the base.

The three types of wavelength conversion members are: a red wavelength conversion member 107R for converting violet light, near-ultraviolet light, ultraviolet light, and so on emitted from the LED 105 into red light; a green wavelength conversion member 107G for converting violet light, near-ultraviolet light, ultraviolet light, and so on emitted from the LED 105 into green light; and a blue wavelength conversion member 107B for converting violet light, near-ultraviolet light, ultraviolet light, and so on emitted from the LED 105 into blue light.

The reflector 109 has a cone-shaped through-hole whose diameter gradually increases toward the diffuser panel 111, and has a reflective surface 109a on which the through-hole has been formed.

With the above structure, especially with inclusion of the three types of wavelength conversion members 107R, 107G, and 107B, the light emitting device 101 outputs white light obtained by combining red light, green light, and blue light that have been wavelength-converted.

In the present modification example, in order to increase blue light in combined light, it is only necessary to roughen all or part of a surface (upper surface and/or lower surface) of the blue wavelength conversion member 107B. On the contrary, in order to decrease blue light in combined light, it is only necessary to make all or part of the surface of the blue wavelength conversion member 107B closer to a mirrored surface.

Figure 26:
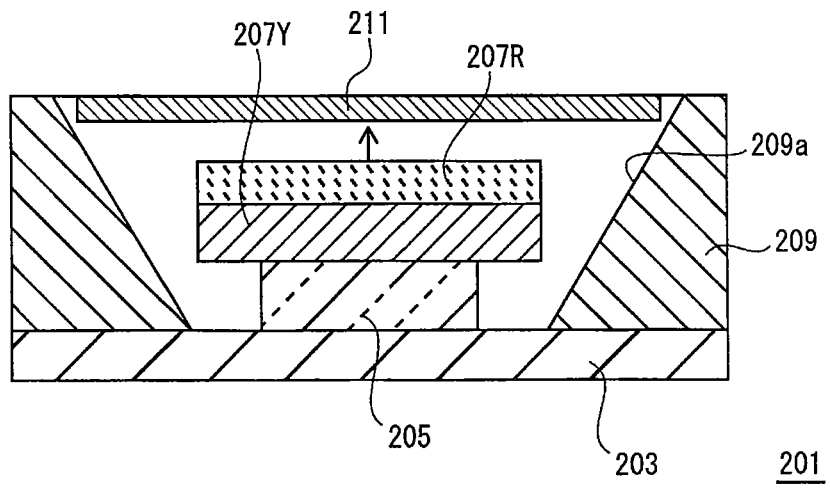
FIG. 26 is a schematic view of a light emitting device relating to a modification example 2.

FIG. 26 is a schematic view of the light emitting device relating to the modification example 2.

A light emitting device 201 relating to the modification example 2 includes a substrate 203, an LED 205 emitting blue light, two types of wavelength conversion members, namely, a yellow wavelength conversion member 207Y and a red wavelength conversion member 207R, a reflector 209 having a reflective surface 209a as its inner surface, and a diffuser panel 211. The modification example 2 differs from the embodiment 1 in that the red wavelength conversion member 207R is included in the light emitting device in addition to the yellow wavelength conversion member 207Y.

In the present modification example, since the red wavelength conversion member is used, it is possible to adjust color temperature by adjusting a surface state of the red wavelength conversion member. Note that the color temperature is used here as a concept included in the chromaticity.

Figure 27:
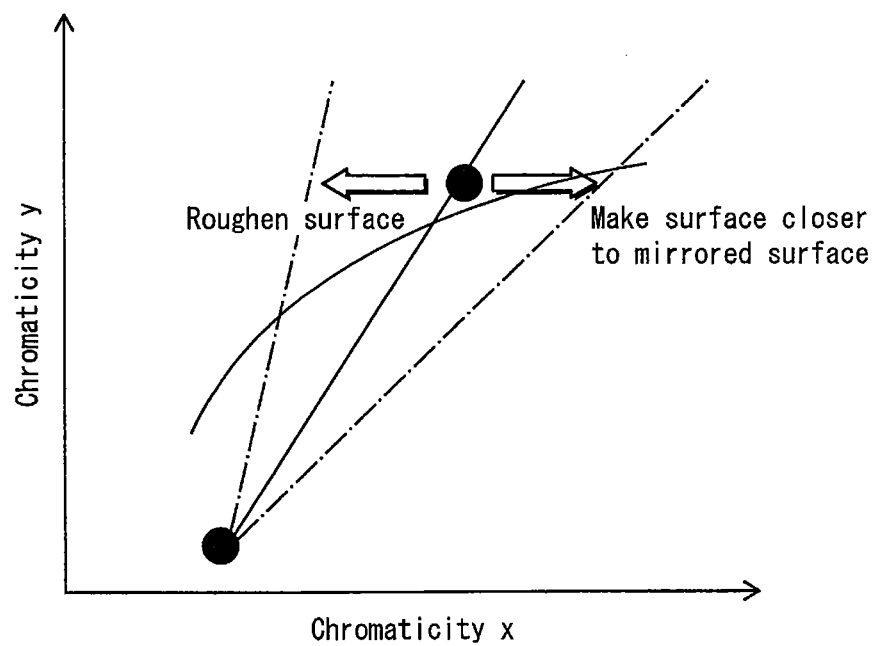
FIG. 27 shows the relationship between a surface state of a red wavelength conversion member and the chromaticity

FIG. 27 shows the relationship between the surface state of the red wavelength conversion member and the chromaticity.

As shown in FIG. 27, as the surface of the red wavelength conversion member is made rougher, the chromaticity is shifted rightward more (in a direction in which the chromaticity x increases). On the contrary, as the surface of the red wavelength conversion member is made closer to a mirrored surface, the chromaticity is shifted leftward more (in a direction in which the chromaticity x decreases).

Accordingly, in order to increase the color temperature, it is only necessary to make the surface of the red wavelength conversion member closer to a mirrored surface. On the contrary, in order to decrease the color temperature, it is only necessary to roughen the surface of the red wavelength conversion member.

(2) Main Material

In the embodiments, as the main material of the wavelength conversion member, ceramic (YAG) is used. Alternatively, other material may of course be used as the main material. For example, a resin such as epoxy, silicone, and fluorine, and a glass material may be employed, as long as they are each a translucent material.

(3) Phosphor Material

In the embodiments and so on, as the phosphor material, it may be possible to employ a phosphor material that contains a constituent element group including at least one selected from the group consisting of Mg, Ca, Sr, Ba, Y, La, Gd, Tb, and Lu, in which part of the constituent element group is displaced with $Ce^{3+}$. Alternatively, other phosphor material may be employed.

Also, in the embodiment 1, an LED emitting blue light is used such that white light is output from the light emitting device. Accordingly, as the phosphor material of the wavelength conversion member, a phosphor material is used that contains a constituent element group that converts blue light into yellow light. Alternatively, in the case of an LED emitting light of other color or a light emitting device outputting light of other color, it may of course be possible to employ a phosphor material corresponding to light of other color.

(4) Surface State

In the embodiments and so on, the optical properties are adjusted by partially changing the surface state of the wavelength conversion member. That is, the optical properties are adjusted by making part of the surface of the wavelength conversion member different in surface state from other remaining part of the surface of the wavelength conversion member.

Alternatively, it is possible to adjust the optical properties, also by changing the state of all parts of the surface of the wavelength conversion member. For example, according to the light emitting device relating to the embodiment 2, in the case where blue light emitted from the LED has a low intensity, all parts of the surface of the wavelength conversion member are made closer to a mirrored surface. This enables light output from the light emitting device to shift to yellow light. As a result, desired optical properties can be exhibited.

Furthermore, in the embodiments and so on, the surface of the wave conversion member whose state has been changed is an outer surface of the wavelength conversion member (corresponding to "light emitting surface" of the present invention). In other words, the surface whose state has been changed is a surface opposite to a surface of the wavelength conversion member facing the light emitting elements (LEDs) (corresponding to "light incident surface" of the present invention). Alternatively, the surface whose state is to be changed may be an inner surface of the wavelength conversion member. Further alternatively, the state change whose state is to be changed may be both the inner surface and the outer surface of the wavelength conversion member. In this case, the state of all of each of the inner surface and the outer surface may be changed, or the state of part of each of the inner surface and the outer surface may be changed.

Furthermore, the surface (outer surface and/or inner surface) of the wavelength conversion member is finished by performing buffing (buffing process), W/E (W/E process), or the like. Alternatively, other method may be employed for changing the surface state. For example, dimple process may be employed such as laser process.

4. Light Emitting Device (1) Number of Light Emitting Elements

The embodiment 1 has described the light emitting device including four LEDs such as shown in FIG. 1 to FIG. 3 and FIG. 20. Also, the embodiment 2 has described the light emitting device including a single LED. The present invention is not limited to these, and may of course include a light emitting device including light emitting elements different in number from those described in the embodiments.

(2) Arrangement of Light Emitting Elements

In the embodiment 1, four LEDs are arranged in line. Alternatively, the LEDs may of course be arranged in other form. The following describes a modification example 3 where a light emitting device includes 16 LEDs that are arranged in a square matrix of four rows and four columns. Alternatively, the 16 LEDs may of course be arranged in other form.

Figure 28A:
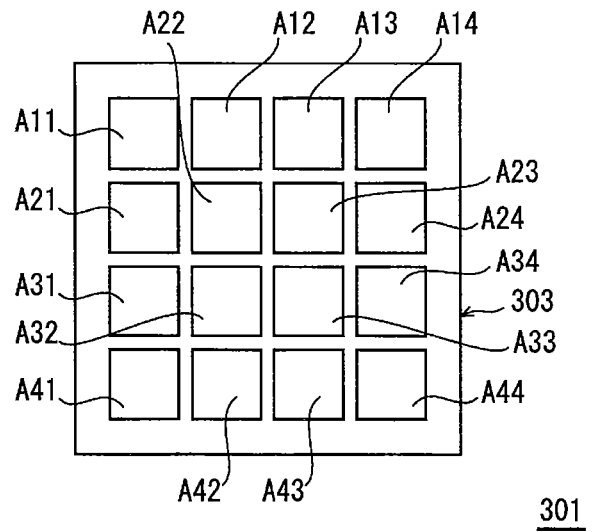
FIG. 28A is a plane view of a state of a light emitting device relating to a modification example 3 from which a wavelength conversion member is removed for convenience of description.
Figure 28B:
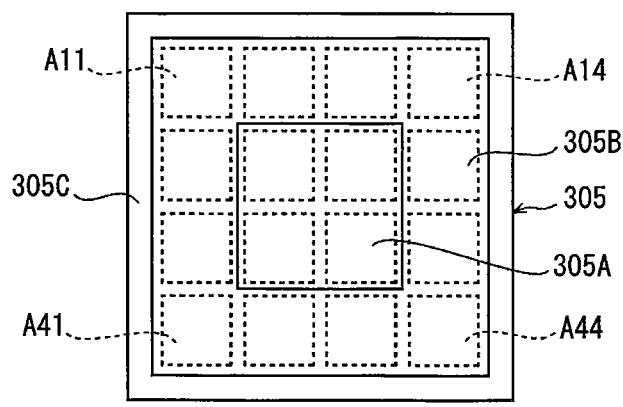
FIG. 28B is a plane view of the light emitting device to which the wavelength conversion member is fixed.
Figure 28C:
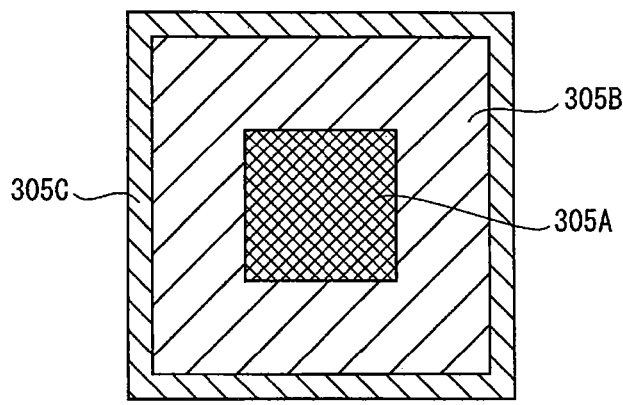
FIG. 28C shows a surface state of the wavelength conversion member.

FIG. 28A is a plane view of a state of a light emitting device relating to the modification example 3 from which a wavelength conversion member is removed for convenience of description. FIG. 28B is a plane view of the light emitting device to which the wavelength conversion member is fixed. FIG. 28C shows the surface state of the wavelength conversion member.

As shown in FIG. 28A, a light emitting device 301 includes 16 LEDs arranged in a square matrix, and is mounted on a substrate 303. Each LED is represented by a referential numeral "Anm (n and m are each a positive integer)", where "n" represents a row, and "m" represents a column. Since the use of the referential numeral Anm makes it difficult to distinguish between the LEDs, the terms "LED" and "Anm" are hyphenated. For example, an LED-A23 indicates an LED arranged in the second row in the third column.

As shown in FIG. 28B, a wavelength conversion member 305 has an area larger than a region on which 16 LEDs-Anm are mounted. Note that the wavelength conversion member 305 is positioned above the LEDs-Anm, in the same way as in the embodiment 1 described with reference to FIG. 2 and FIG. 3.

The wavelength conversion member 305 has a surface separated into three regions each having a different surface state. The three regions are a central region 305A, a middle region 305B that is positioned at an outer periphery of the central region 305A, and a peripheral region 305C that is positioned at an outer periphery of the middle region 305B.

Here, the central region 305A is positioned above four LEDs that are located in the center in the matrix of four rows and four columns, namely LED-A22, LED-A23, LED-A32, and LED-A33. The middle region 305B is positioned above 12 LEDs that are located in the periphery in the matrix of four rows and four columns, namely LED-A11, LED-A12, LED-A13, LED-A14, LED-A21, LED-A24, LED-A31, LED-A34, LED-A41, LED-A42, LED-A43, and LED-A44. The peripheral region 305C is positioned above a region in which no LED-Anm is located.

The wavelength conversion member 305 relating to the modification example 3 has a surface state whose roughness decreases gradually (including meaning of in a phased manner) from the central region 305A toward the peripheral region 305C. Specifically, the central region 305A has undergone W/E after #220 buffing (cross-hatched region in FIG. 28C). The middle region 305B has undergone #220 buffing (hatched region with diagonal lines running upwardly from left to right in FIG. 28C). The peripheral region 305C has undergone mirror finishing (hatched region with diagonal lines running downwardly from right to left in FIG. 28C).

According to the wavelength conversion member 305 relating to the modification example 3, the surface of a region corresponding to a longer optical path length of light emitted from the LED-Anm has been finished so as to be closer to a mirrored surface, and the surface of a region corresponding to a shorter optical path length of light emitted from the LED-Anm has been finished so as to be rough (#220 buffing).

5. Supplementary

In each of the embodiments and the modification examples, characteristics have been described. It may be possible to combine the structures of the embodiments and the modification examples with one another.

6. Others

The description has been provided on that the light emitting device relating to the embodiments, the modification examples, and so on includes light emitting elements and one or more wavelength conversion members, and is capable of adjusting the chromaticity (including color temperature) and furthermore reducing the color unevenness, by changing the state of part or all of a surface (outer surface and/or inner surface) of the wavelength conversion member.

On the other hand, there has been conventionally used a light emitting device that outputs light, which is obtained by performing color-mixing with use of a diffuser panel on light emitted from a plurality of light emitting elements each emitting light of different color. This light emitting device has a problem. For example, color unevenness occurs on a surface of the diffuser panel that is a light emitting surface of the light emitting device, and light of a desired color cannot be output.

In response to such a problem, it is possible to apply the above adjustment method relating to the present invention. The following describes a reference example.

Figure 29:
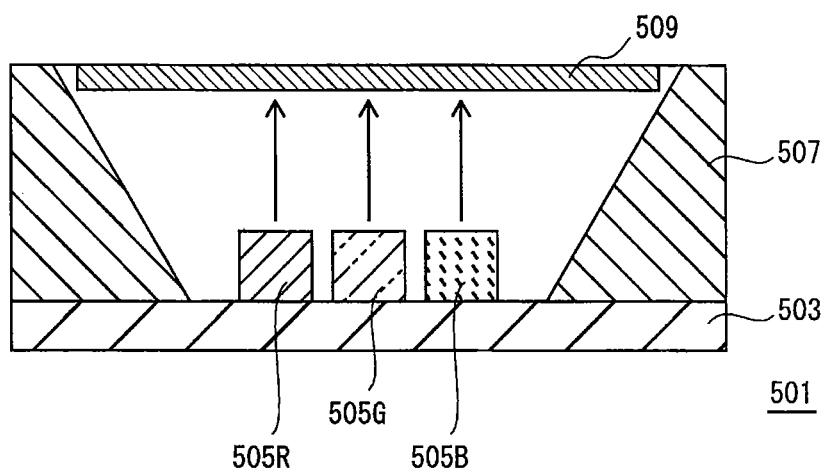
FIG. 29 is a schematic view of a light emitting device relating to a reference example.

FIG. 29 is a schematic view of a light emitting device relating to a reference example.

A light emitting device 501 includes, as shown in FIG. 29, a substrate 503, two or more light emitting elements (LEDs) 505 each emitting light of a different color, a reflector for reflecting light emitted from the light emitting elements 505 in a predetermined direction, and a diffuser panel 509 for performing color-mixing on light emitted from the light emitting elements 505 and reflected light.

The light emitting elements 505 here are three in number, and each emit light of a different color. Specifically, the light emitting elements 505 are a light emitting element 505R emitting red color, a light emitting element 505G emitting green light, and a light emitting element 505B emitting blue light.

The light emitting device 501 relating to the present reference example also can improve the optical properties by making part of a surface of the diffuser panel 509 different in surface state from other remaining part of the surface of the diffuser panel 509. Specifically, in the case where, for example, light output from the light emitting device 501 has a low ratio of blue light, part of the surface of the diffuser panel 509 that is positioned above the light emitting element 505B emitting blue light is made closer to a mirrored surface. This increases the transmission amount of blue light, thereby approximating to light of a desired color.

In this case, optical properties such as color of light are adjusted with use of a method for adjusting optical properties of light, which is obtained by diffusing light emitted from a plurality of light emitting sources emitting light having predetermined wavelengths by a diffuser, and combining light having a plurality of wavelengths emitted from the diffuser. Optical properties are adjusted by changing at least part of a light incident surface and a light emitting surface of the diffusing member.

Also, the above light emitting device is manufactured with use of a method for manufacturing a light emitting device that comprises: a plurality of light emitting sources emitting predetermined wavelengths; and a diffusing member diffusing a plurality of lights emitted from the plurality of light emitting sources, and outputs light having optical properties within a predetermined range which is obtained by combining a plurality of lights emitted from the diffusing member. The method includes a measuring step of measuring the optical properties of the combined light; and an adjusting step of, when the optical properties measured in the measuring step is out of the predetermined range, adjusting a state of at least part of at least one of a light incident surface and a light emitting surface of the diffusing member.

INDUSTRIAL APPLICABILITY

The present invention is usable for suppressing the color unevenness of light output from a light emitting device, and adjusting color of the output light so as to fall within a desired range.

REFERENCE SIGNS LIST 1 light emitting device
3 substrate
5 LED (light emitting element)
7 wavelength conversion member

The invention claimed is:

1. A light emitting device comprising:
a light emitting source; and
a wavelength conversion member that converts wavelengths of at least part of light emitted from the light emitting source to at least one other wavelength, and outputting light obtained by combining light having at least two wavelengths emitted from the wavelength conversion member, wherein
the wavelength conversion member has a light incident surface and a light emitting surface,
at least one of the light incident surface and the light emitting surface of the wavelength conversion member has a region where at least part of particle boundaries of a ceramic material is exposed,
such that a V-shaped groove is formed at the particle boundaries, wherein the sides of the V-shaped groove forms sides of a concavo-convex shape having a trapezoidal cross section.

2. The light emitting device of claim 1, wherein
the ceramic material has a particle diameter of 8 μm to 60 μm.

3. The light emitting device of claim 2, wherein
the trapezoidal cross section has a base diameter of 8 μm to 60 μm and a depth of greater than 0 μm to 4 μm.

4. The light emitting device of claim 1, wherein the light incident surface and the light emitting surface each have a concavo-convex shape, and the V-shaped groove is indicated by at least one of a depth and a pitch of the concavo-convex shape.

5. The light emitting device of claim 1, wherein
the light emitting source is composed of a plurality of light emitting elements that are mounted on a main surface of a substrate, and
the V-shaped groove of the at least one of the light incident surface and the light emitting surface gradually decreases in depth from a center toward a periphery on the surface.

6. The light emitting device of claim 1, wherein
the wavelength conversion member is made of a translucent material that contains a phosphor material.

7. The light emitting device of claim 1, wherein
the V-shaped groove has a depth of greater than 0 μm to 4 μm.

8. The light emitting device of claim 1, wherein
the trapezoidal cross section has a base diameter of 8 μm to 50 μm.

9. A light emitting device comprising:
a plurality of light emitting sources for collectively emitting light;
a single wavelength conversion member that contains phosphor material and receives the emitted light from each of the plurality of light emitting sources with a light incident surface and a light emitting surface, the wavelength conversion member converts wavelengths of at least part of the light emitted and light received to at least one other wavelength and outputs light obtained by combining light having at least two wavelengths, wherein
one separate region of the light incident surface and the light emitting surface has a mirror finished surface configured to increase an intensity of light at approximately 440 mm and another separate region of the light incident surface and the light emitting surface has a coarse finished surface configured to increase an intensity of light at approximately 550 mm to provide a predetermined optical property of the light emitting device.

* * * * *